United States Patent
Hayashi et al.

(10) Patent No.: US 11,702,596 B2
(45) Date of Patent: Jul. 18, 2023

(54) POLYMERIZABLE LIQUID CRYSTAL COMPOSITION, OPTICALLY ANISOTROPIC FILM, OPTICAL FILM, POLARIZING PLATE, AND IMAGE DISPLAY DEVICE

(71) Applicant: FUJIFILM Corporation, Tokyo (JP)

(72) Inventors: Daisuke Hayashi, Kanagawa (JP); Hiroshi Matsuyama, Kanagawa (JP); Keita Takahashi, Kanagawa (JP); Keisuke Yoshimasa, Kanagawa (JP); Nobuyuki Akutagawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 328 days.

(21) Appl. No.: 16/992,657

(22) Filed: Aug. 13, 2020

(65) Prior Publication Data
US 2020/0369962 A1 Nov. 26, 2020

Related U.S. Application Data

(63) Continuation of application No. PCT/JP2019/006500, filed on Feb. 21, 2019.

(30) Foreign Application Priority Data

Feb. 21, 2018 (JP) .............................. JP2018-028689

(51) Int. Cl.
*C09K 19/38* (2006.01)
*C08F 222/24* (2006.01)
(Continued)

(52) U.S. Cl.
CPC ........ *C09K 19/3861* (2013.01); *C08F 222/24* (2013.01); *G02B 5/3016* (2013.01); *C09K 2019/0448* (2013.01); *C09K 2323/03* (2020.08); *C09K 2323/031* (2020.08); *C09K 2323/035* (2020.08); *G02F 1/13363* (2013.01); *H10K 50/86* (2023.02)

(58) Field of Classification Search
CPC ............ C09K 19/3861; C09K 19/3491; C09K 19/3068; C09K 19/542; C09K 19/3852;
(Continued)

(56) References Cited

U.S. PATENT DOCUMENTS

2009/0252898 A1* 10/2009 Tomita .................. C08F 220/00
428/1.33
2010/0045901 A1* 2/2010 Uehira ................. C07D 277/64
349/193
(Continued)

FOREIGN PATENT DOCUMENTS

CN 101470212 A 7/2009
CN 105524625 A 4/2016
(Continued)

OTHER PUBLICATIONS

Office Action, issued by the Japanese Patent Office dated Jul. 13, 2021, in connection with Japanese Patent Application No. 2020-501027.
(Continued)

*Primary Examiner* — Ruiyun Zhang
(74) *Attorney, Agent, or Firm* — Edwards Neils LLC; Jean C. Edwards, Esq.

(57) ABSTRACT

Provided is a polymerizable liquid crystal composition used for formation of an optically anisotropic film having excellent durability, an optically anisotropic film, an optical film, a polarizing plate, and an image display device. The polymerizable liquid crystal composition contains a polymerizable liquid crystal compound represented by Formula (1) and an acidic compound, in which a pKa of the acidic compound is more than −10 and 5 or less, and a content of the acidic compound is 20 parts by mass or less with respect to 100 parts by mass of the polymerizable liquid crystal compound.

(Continued)

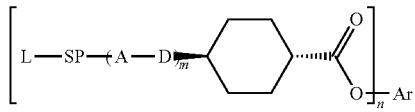

(1)

1 Claim, 1 Drawing Sheet

(51) Int. Cl.
*G02B 5/30* (2006.01)
*C09K 19/04* (2006.01)
*G02F 1/13363* (2006.01)
*H10K 50/86* (2023.01)

(58) Field of Classification Search
CPC .......... C09K 19/54; C09K 2019/0448; C09K 2323/03; C09K 2323/031; C09K 2323/035; G02F 1/133528; G02F 1/13363; C07D 339/06; G02B 5/3016
USPC .................. 428/1.3, 1.31, 1.33; 349/96, 117
See application file for complete search history.

(56) References Cited

U.S. PATENT DOCUMENTS

2015/0175564 A1 6/2015 Sakamoto et al.
2015/0277006 A1 10/2015 Takasago et al.
2016/0108315 A1 4/2016 Matsuyama et al.
2017/0292075 A1 10/2017 Endo et al.

FOREIGN PATENT DOCUMENTS

| JP | 2004-354962 A | 12/2004 |
| JP | 2006-276061 A | 10/2006 |
| JP | 2009-080450 A | 4/2009 |
| JP | 2010-031223 A | 2/2010 |
| JP | 2010-084032 A | 4/2010 |
| JP | 2012-215706 A | 11/2012 |
| JP | 2014-153569 A | 8/2014 |
| JP | 2016-053709 A | 4/2016 |
| JP | 2016-081035 A | 5/2016 |
| JP | 2017-098290 A | 6/2017 |
| JP | 2018-025614 A | 2/2018 |
| JP | 2018-203945 A | 12/2018 |
| WO | 2014/010325 A1 | 1/2014 |
| WO | 2016/043087 A1 | 3/2016 |

OTHER PUBLICATIONS

International Search Report issued in PCT/JP2019/006500 dated May 21, 2019.
Written Opinion issued in PCT/JP2019/006500 dated May 21, 2019.
International Preliminary Report on Patentability completed by WIPO dated Aug. 27, 2020 in connection with International Patent Application No. PCT/JP2019/006500.
Office Action, issued by the State Intellectual Property Office dated Oct. 18, 2021, in connection with Chinese Patent Application No. 201980013712.8.
P. Wojciechowski et al., Thermally Stable Optically Anisotropic Polymer Networks Obtained From Mesogenic LC Cellulose Derivatives, Advanced Materials for Optics and Electronics, 1996, pp. 383-386, vol. 6, John Wiley & Sons, Inc., Hoboken, NJ, USA.

* cited by examiner

POLYMERIZABLE LIQUID CRYSTAL COMPOSITION, OPTICALLY ANISOTROPIC FILM, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2019/006500 filed on Feb. 21, 2019, which was published under PCT Article 21(2) in Japanese, and which claims priority under 35 U.S.C. § 119(a) to Japanese Patent Application No. 2018-028689 filed on Feb. 21, 2018. The above applications are hereby expressly incorporated by reference, in their entirety, into the present application.

BACKGROUND OF THE INVENTION

1. Field of the Invention

The present invention relates to a polymerizable liquid crystal composition, an optically anisotropic film, an optical film, a polarizing plate, and an image display device.

2. Description of the Related Art

A polymerizable compound exhibiting reciprocal wavelength dispersibility enables, for example, accurate conversion of light ray wavelengths over a wide wavelength range and reduction in the thickness of a phase difference film due to its high refractive index, and therefore, it has been actively studied.

Furthermore, for the polymerizable compound exhibiting reciprocal wavelength dispersibility, T-type molecular design guidelines have generally been adapted, and thus, it has been required to decrease the wavelength of the major axis of the molecule and increase the wavelength of the minor axis positioned at the center of the molecule.

In this regard, it is known that a cycloalkylene skeleton having no absorption wavelength is used for connection between a skeleton of the minor axis positioned at the center of the molecule (hereinafter also referred to as a "reciprocal wavelength dispersion expressing part") and the major axis of the molecule (see, for example, JP2010-031223A, WO2014/010325A, and JP2016-081035A).

SUMMARY OF THE INVENTION

The present inventors have examined JP2010-031223A, WO2014/010325A, and JP2016-081035A, and have thus found that an optically anisotropic film thus formed has a durability problem in that a birefringence index changes in a case where the optically anisotropic film is exposed to a high temperature or a high humidity depending on the type of a polymerizable compound, the type of a polymerization initiator, and polymerization conditions such as a curing temperature.

Therefore, an object of the present invention is to provide a polymerizable liquid crystal composition used for formation of an optically anisotropic film having excellent durability, an optically anisotropic film, an optical film, a polarizing plate, and an image display device.

The present inventors have conducted intensive studies to accomplish the object, and as a result, they have found that in a case where an acidic compound satisfying a specific pKa value is used together with the polymerizable liquid crystal compound, the durability of an optically anisotropic film thus formed is improved, thereby completing the present invention.

That is, the present inventors have found that the object can be accomplished by the following configurations.

[1] A polymerizable liquid crystal composition comprising:
a polymerizable liquid crystal compound represented by Formula (1) which will described later; and
an acidic compound,
in which a pKa of the acidic compound is more than −10 and 5 or less, and
a content of the acidic compound is 20 parts by mass or less with respect to 100 parts by mass of the polymerizable liquid crystal compound.

[2] The polymerizable liquid crystal composition as described in [1],
in which a value of the pKa of the acidic compound and the value of the content of the acidic compound with respect to 100 parts by mass of the polymerizable liquid crystal compound satisfy Expression (I), $$0.01 \leq \text{Value of content}/(\text{Value of pKa}+10) \leq 1.5 \qquad (I).$$

[3] The polymerizable liquid crystal composition as described in [1] or [2],
in which the acidic compound has a molecular weight of 120 or more.

[4] The polymerizable liquid crystal composition as described in any one of [1] to [3],
in which the acidic compound is at least one compound selected from the group consisting of a phosphoric acid compound, a phosphonic acid compound, and a sulfonic acid compound.

[5] The polymerizable liquid crystal composition as described in any one of [1] to [4],
in which n in Formula (1) which will be described later represents 2 and Ar in Formula (1) which will be described later is any aromatic ring selected from the group consisting of groups represented by Formulae (Ar-1) to (Ar-5) which will be described later.

[6] An optically anisotropic film obtained by polymerizing the polymerizable liquid crystal composition as described in any one of [1] to [5].

[7] The optically anisotropic film as described in [6], in which the polymerizable liquid crystal compound included in the polymerizable liquid crystal composition is horizontally aligned after polymerization.

[8] An optical film comprising the optically anisotropic film as described in [6] or [7].

[9] A polarizing plate comprising:
the optical film as described in [8]; and
a polarizer.

[10] An image display device comprising the optical film as described in [8] or the polarizing plate as described in [9].

According to the present invention, it is possible to provide a polymerizable liquid crystal composition used for formation of an optically anisotropic film having excellent durability, an optically anisotropic film, an optical film, a polarizing plate, and an image display device.

DESCRIPTION OF THE PREFERRED EMBODIMENTS

Figure 1A:
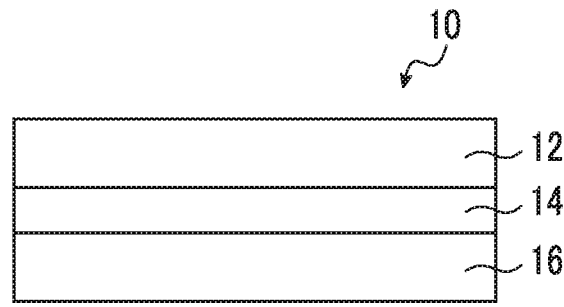
FIG. 1A is a schematic cross-sectional view showing an example of an optical film of an embodiment of the present invention.

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In addition, in the present specification, the bonding direction of a divalent group (for example, —O—CO—) as noted is not particularly limited unless the bonding position is specified, and for example, in a case where $D^1$ in Formula (Ar-3) which will be described later is —CO—O—, $D^1$ may be either *1-CO—O—*2 or *1-O—CO—*2, in which *1 represents a bonding position to the $SP^1$ side and *2 represents a bonding position to the carbon atom side.

Polymerizable Liquid Crystal Composition

The polymerizable liquid crystal composition of an embodiment of the present invention is a polymerizable liquid crystal composition containing a polymerizable liquid crystal compound represented by Formula (1) which will be described later (hereinafter also simply referred to as a polymerizable liquid crystal compound), and an acidic compound.

Furthermore, a pKa of the acidic compound is more than −10 and 5 or less.

In addition, a content of the acidic compound is 20 parts by mass or less with respect to 100 parts by mass of the polymerizable liquid crystal compound.

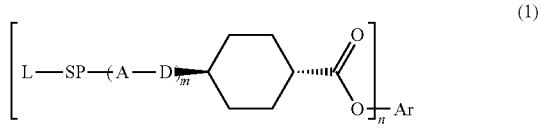

In the present invention, the durability of an optically anisotropic film thus formed is improved by blending the polymerizable liquid crystal compound (1) with an acidic compound having a pKa of more than −10 and 5 or less (hereinafter also simply referred to as a "specific acidic compound") as described above.

A reason therefor is not specifically clear, but is presumed to be as follows by the present inventors.

First, the present inventors have presumed that deterioration of the durability is caused by a fact that an ester bond used to link Ar in Formula (1) with the major axis of the molecule is hydrolyzed in a high-temperature or high-humidity environment, and thus, a part of the liquid crystal compound fixed by the polymerizable group is released and holds mobility, leading to a change in the birefringence index.

Accordingly, in the present invention, it is considered that by blending the specific acidic compound, a basic component incorporated in the system of the composition is neutralized, the progress of hydrolysis accelerated by the presence of the basic component is suppressed, and as a result, the durability is improved.

Hereinafter, the respective components of the polymerizable liquid crystal composition of the embodiment of the present invention will be described in detail.

Polymerizable Liquid Crystal Compound (1)

The polymerizable liquid crystal compound (1) contained in the polymerizable liquid crystal composition of the embodiment of the present invention is a polymerizable liquid crystal compound represented by Formula (1).

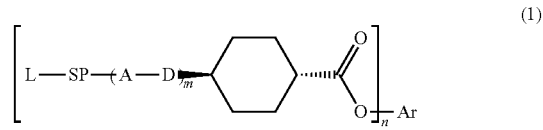

In Formula (1), Ar represents an n-valent aromatic group.

D represents a single bond, —COO—, or —OCO—.

A represents an aromatic ring having 6 or more carbon atoms, which may have a substituent, or a cycloalkane ring having 6 or more carbon atoms, which may have a substituent.

SP represents a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent.

L represents a polymerizable group.

m represents an integer of 0 to 2, and n represents an integer of 1 or 2.

It should be noted that a plurality of D's, A's, SP's, and L's, all of which are plural depending on a value of m or n, may be the same as or different from each other.

In Formula (1), the aromatic group represented by Ar refers to a group including a ring having aromaticity, and examples thereof include an n-valent group including at least one aromatic ring selected from the group consisting of an aromatic hydrocarbon ring and an aromatic heterocyclic ring.

Here, examples of the aromatic hydrocarbon ring include a benzene ring, a naphthalene ring, an anthracene ring, and a phenanthroline ring.

Examples of the aromatic heterocyclic ring include a furan ring, a pyrrole ring, a thiophene ring, a pyridine ring, a thiazole ring, and a benzothiazole ring.

Among those, a benzene ring, a thiazole ring and a benzothiazole ring are preferable, In Formula (1), examples of the aromatic ring having 6 or more carbon atoms represented by A include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring. Among those, the benzene ring (for example, a 1,4-phenyl group) is preferable.

Furthermore, in Formula (1), examples of the cycloalkane ring having 6 or more carbon atoms represented by A include a cyclohexane ring, a cyclopeptane ring, a cyclooctane ring, a cycododecane ring, and a cyclodocosane ring, and among these, the cyclohexane ring (for example, a cyclohexane-1,4-diyl group) is preferable.

In addition, examples of the substituent which may be contained in the aromatic ring having 6 or more carbon atoms or the cycloalkane ring having 6 or more carbon atoms include the same ones as the substituent which may be contained in $Y^1$ in Formula (Ar-1) which will be described later.

In Formula (1), suitable examples of the linear or branched alkylene group having 1 to 12 carbon atoms represented by SP include a methylene group, an ethylene group, a propylene group, a butylene group, a pentylene group, a hexylene group, a methylhexylene group, and a heptylene group. Incidentally, $SP^1$ and $SP^2$ may be a divalent linking group in which one or more of —$CH_2$—'s constituting the linear or branched alkylene group having 1 to 12 carbon atoms are substituted with —O—, —S—, —NH—, —N(Q)-, or —CO—, as described above, and examples of the substituent represented by Q include the same ones as the substituents which may be contained in $Y^1$ in Formula (Ar-1).

In Formula (1), the polymerizable group represented by L is not particularly limited, but is preferably a polymerizable group which is radically polymerizable or cationically polymerizable.

A generally known radically polymerizable group can be used as the radically polymerizable group, and suitable examples thereof include an acryloyl group and a methacryloyl group. In this case, it is known that the acryloyl group generally has a high polymerization rate, and from the viewpoint of improvement of productivity, the acryloyl group is preferable but the methacryloyl group can also be used in the same manner as the polymerizable group.

A generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and an epoxy group, an oxetanyl group, or the vinyloxy group is particularly preferable.

Particularly preferred examples of the polymerizable group include the following groups.

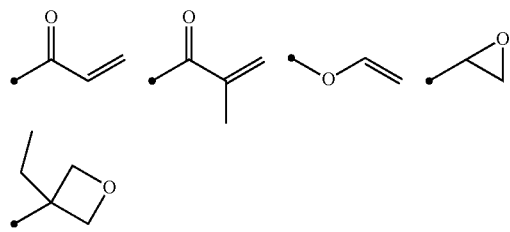

In Formula (1), m represents an integer of 0 to 2, and is preferably 1 or 2, and more preferably 1 for a reason that sufficient rigidity for exhibiting liquid crystallinity is exhibited.

Furthermore, in Formula (1), n represents an integer of 1 or 2, and is preferably 2 for a reason that synthesis is easily performed liquid crystallinity is easily expressed.

In the present invention, for a reason that in a case where a polymerizable liquid crystal compound having reciprocal wavelength dispersibility among polymerizable liquid crystal compounds is used, the decomposition tends to be remarkable, it is preferable that the polymerizable liquid crystal compound represented by Formula (1) is a compound exhibiting reciprocal wavelength dispersibility.

Here, the polymerizable liquid crystal compound with "reciprocal wavelength dispersibility" means that in a case where an in-plane retardation (Re) value at a specific wavelength (visible light range) of a phase difference film manufactured using the polymerizable liquid crystal compound is measured, the Re value is equal or higher as a measurement wavelength is increased.

Suitable examples of the compound exhibiting reciprocal wavelength dispersibility include the compounds in which n in Formula (1) represents 2 and Ar in Formula (1) represents any aromatic ring selected from the group consisting of the groups represented by Formulae Ar-1) to (Ar-5). Incidentally, in Formulae (Ar-1) to (Ar-5), * represents a bonding position to an oxygen atom.

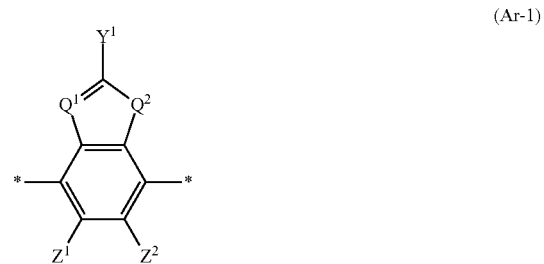

(Ar-1)

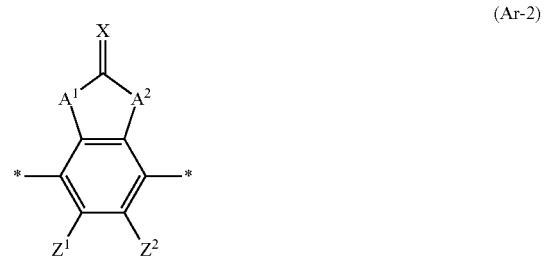

(Ar-2)

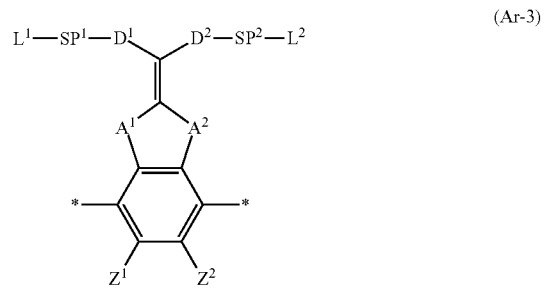

(Ar-3)

-continued

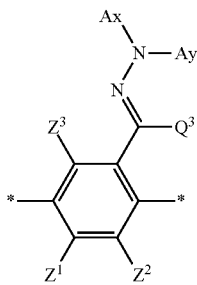

(Ar-4)

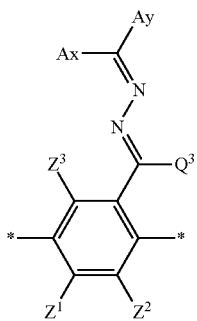

(Ar-5)

Here, in Formula (Ar-1), $Q^1$ represents N or CH, $Q^2$ represents —S—, —O—, or —N($R^1$)—, $R^1$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, each of which may have a substituent.

Specific examples of the alkyl group having 1 to 6 carbon atoms represented by $R^1$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, and a pyridyl group.

Furthermore, examples of the substituent which may be contained in $Y^1$ include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxy ethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and among these, the fluorine atom or the chlorine atom is preferable.

In addition, in Formulae (Ar-1) to (Ar-5), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^2$, —$NR^3R^4$, or —$SR^5$, $R^2$ to $R^5$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, and specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[5.2.1.0$^{2.6}$]decyl group, a tricyclo[3.3.1.3$^{.7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms represented by each of $R^6$ to $R^9$ include a methyl group, an ethyl group, a propyl group, an isopropyl group, an n-butyl group, an isobutyl group, a sec-butyl group, a tert-butyl group, an n-pentyl group, and an n-hexyl group.

In addition, in Formulae (Ar-2) and (Ar-3), $A^1$ and $A^2$ each independently represent a group selected from the group consisting of —O—, —N($R^6$)—, —S—, and —CO—, where $R^6$ represents a hydrogen atom or a substituent.

Examples of the substituent represented by $R^6$ include the same ones as the substituents which may be contained in $Y^1$ in Formula (Ar-1).

Furthermore, in Formula (Ar-2), X represents a hydrogen atom or a non-metal atom of Groups XIV to XVI, to which a substituent may be bonded.

Moreover, examples of the non-metal atom of Groups XIV to XVI represented by X include an oxygen atom, a sulfur atom, a nitrogen atom having a substituent, and a carbon atom having a substituent, and specific examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $D^1$ and $D^2$ each independently represent a single bond, or a divalent linking group consisting of —CO—, —O—, —S—, —C(=S)—, —$CR^7R^8$—, —$CR^9$=$CR^{10}$—, —$NR^{11}$—, or a combination of two or more thereof, where $R^7$ to $R^{11}$ each independently represent a hydrogen atom, a fluorine atom, or an alkyl group having 1 to 4 carbon atoms, Here, examples of the divalent linking group represented by each of $D^1$ and $D^2$ include —CO—O—, —C(=S)O—, —$CR^7R^8$—, —$CR^7R^8$—$CR^7R^8$—, —O—$CR^7R^8$—, —$CR^7R^8$—O—$CR^7R^8$, —CO—O—$CR^7R^8$—, —O—CO—$CR^7R^8$—, —$CR^7R^8$—O—CO—$CR^7R^8$—, —$CR^7R^8$—CO—O—$CR^7R^8$, —$NR^{11}$—$CR^7R^8$—, and —CO—$NR^{11}$—. Among those, —CO—O— is preferable.

Moreover, in Formula (Ar-3), $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent. Examples of the substituent include the same ones as the substituents which may be contained in $Y^1$ in Formula (Ar-1).

Here, examples of the divalent linking group include the same groups as those described for SP in Formula (1), Moreover, in Formula (Ar-3), $L^1$ and $L^2$ each independently represent a monovalent organic group.

Here, examples of the monovalent organic group include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatoms constituting the heteroaryl group is preferably a nitrogen atom, a sulfur atom, or an oxygen atom. The number of carbon atoms of the heteroaryl group is preferably 6 to 18, and more preferably 6 to 12. In addition, the alkyl group, the aryl group, and the heteroaryl group may be unsubstituted or have a substituent. Examples of the substituent include the same ones as the substituents which may be contained in $Y^1$ in Formula (Ar-1).

Moreover, in Formulae (Ar-4) and (Ar-5), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) and (Ar-5), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom, or an alkyl group having 1 to 6 carbon atoms, which may have a substituent.

Examples of each of Ax and Ay include the ones described in paragraphs [0039] to [0005] of WO2014/010325A.

Incidentally, specific examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

Specific examples of the polymerizable liquid crystal compound (1) represented by Formula (1) include the compound represented by General Formula (1) described in JP2008-297210A (in particular, the compounds described in paragraph Nos. [0034] to [0039]), the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (1) described in JP2016-081035A (in particular, the compounds described in paragraph Nos. [0043] to [0055]).

Furthermore, for a reason that the reciprocal wavelength dispersibility is improved, examples of the polymerizable liquid crystal compound (1) represented by Formula (1) also include the polymerizable liquid crystal compound in which D in Formula (1) is a single bond and A in Formula (1) represents a cycloalkane ring having 6 or more carbon atoms.

Suitable examples of such a polymerizable liquid crystal compound include compounds represented by Formulae (1) to (10), and specifically the compounds having side chain structures shown in Tables 1 and 2 below as K (side chain structure) in Formulae (1) to (10).

Furthermore, in Tables 1 and 2 below, "*" shown in the side chain structure of K represents a bonding position to an aromatic ring.

Incidentally, in the following description, a compound represented by Formula (1) and having a group shown in 1-1 in Table 1 below is noted as "Compound (1-1-1)", and compounds having other structural formulae and groups are also noted in the same manner. For example, a compound represented by Formula (2) and having a group shown in 2-3 in Table 2 below can be noted as "'Compound (2-2-3)".

In addition, in the side chain structures shown in 1-2 in Table 1 below and 2-2 in Table 2 below, a group adjacent to each of the acryloyloxy group and the methacryloyl group represents a propylene group (a group in which a methyl group is substituted with an ethylene group), and represents a mixture of position isomers in which the positions of the methyl groups are different.

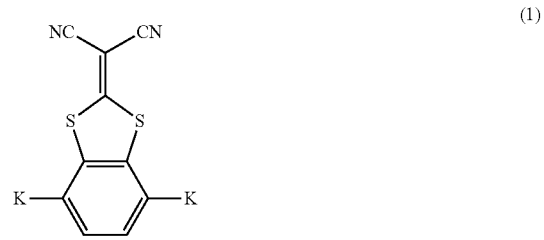

(1)

(2)
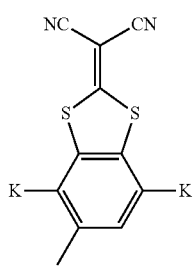
(3)
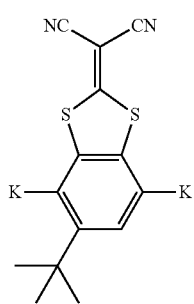
(4)
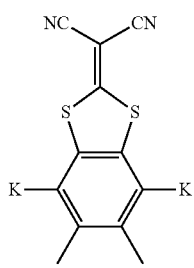
(5)
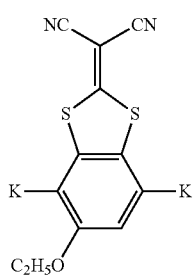
(6)
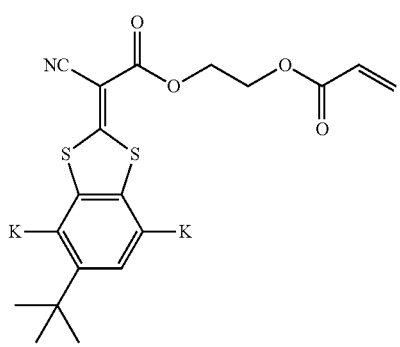
(7)
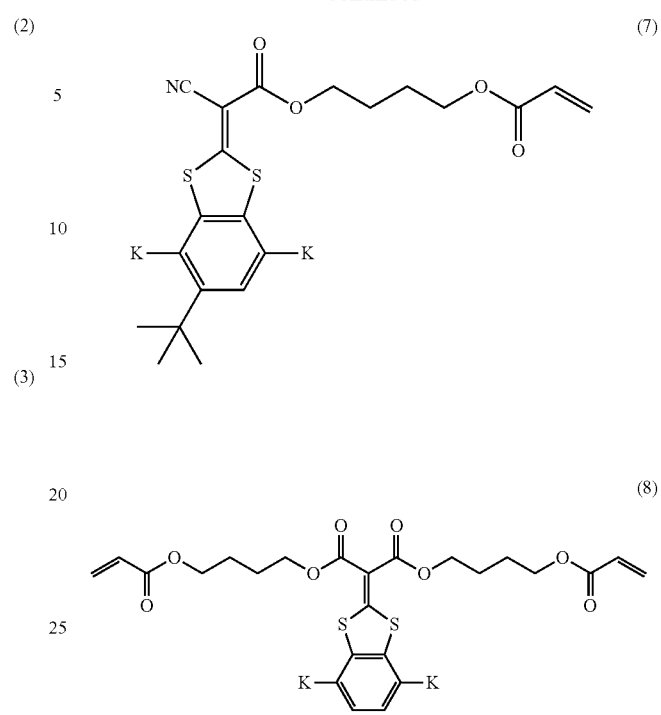
(8)
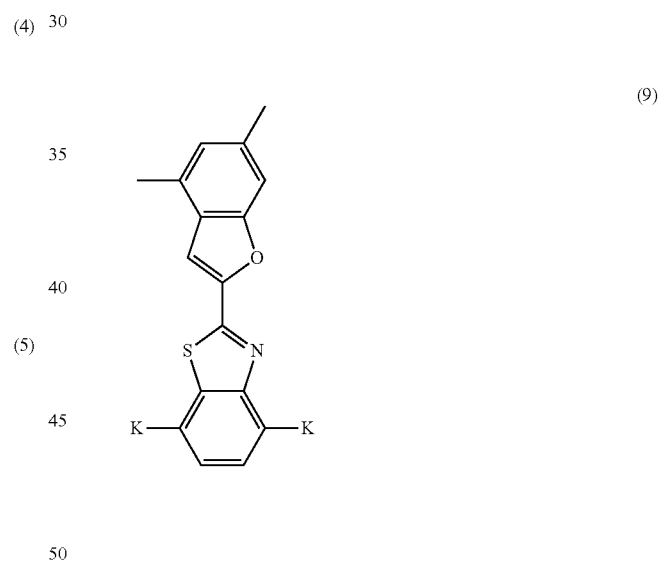
(9)
(10)
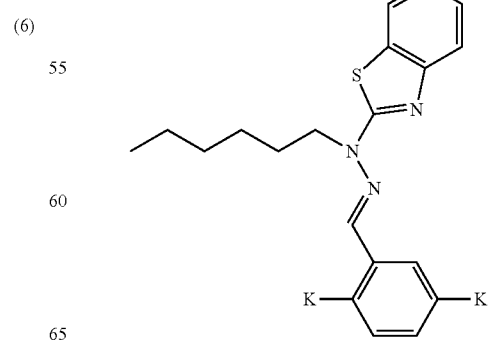

TABLE 1
| | K (side chain structure) |
|---|---|
| 1-1 | 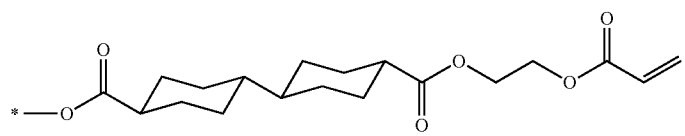 [SMILES: C=CC(=O)OCCOC(=O)C1CCC(C2CCC(C(=O)OC)CC2)CC1] |
| 1-2 | 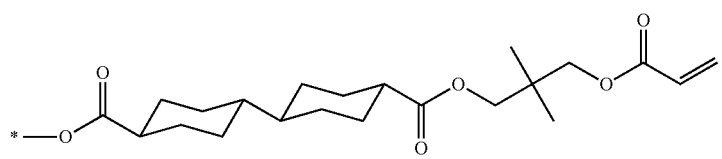 [SMILES: C=CC(=O)OCC(C)(C)COC(=O)C1CCC(C2CCC(C(=O)OC)CC2)CC1] |
| 1-3 | 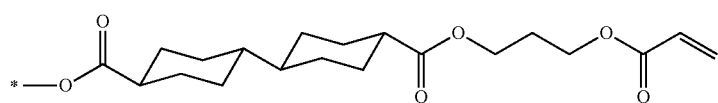 [SMILES: C=CC(=O)OCCCOC(=O)C1CCC(C2CCC(C(=O)OC)CC2)CC1] |
| 1-4 | 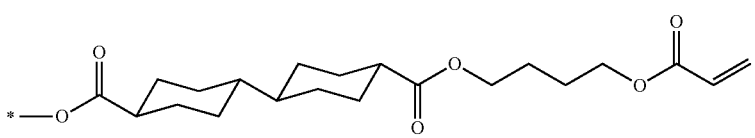 [SMILES: C=CC(=O)OCCCCOC(=O)C1CCC(C2CCC(C(=O)OC)CC2)CC1] |
| 1-5 | 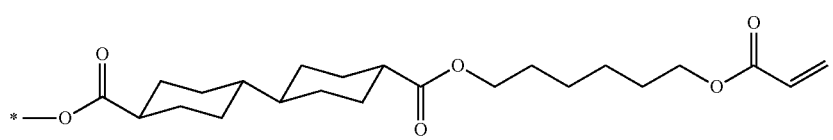 [SMILES: C=CC(=O)OCCCCCCOC(=O)C1CCC(C2CCC(C(=O)OC)CC2)CC1] |
| 1-6 | 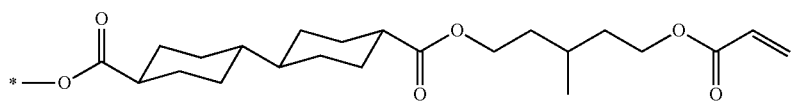 [SMILES: C=CC(=O)OCCC(C)CCOC(=O)C1CCC(C2CCC(C(=O)OC)CC2)CC1] |
| 1-7 | 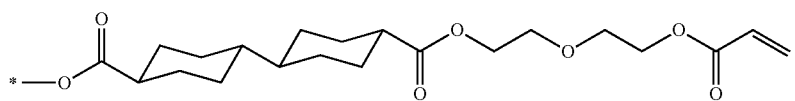 [SMILES: C=CC(=O)OCCOCCOC(=O)C1CCC(C2CCC(C(=O)OC)CC2)CC1] |
| 1-8 | 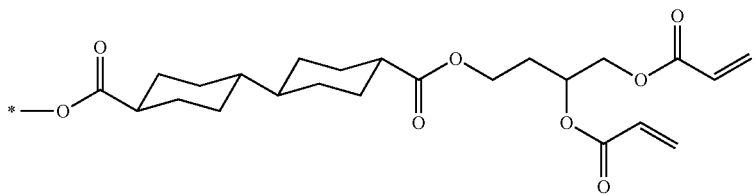 [SMILES: C=CC(=O)OCC(CCOC(=O)C1CCC(C2CCC(C(=O)OC)CC2)CC1)OC(=O)C=C] |
| 1-9 | 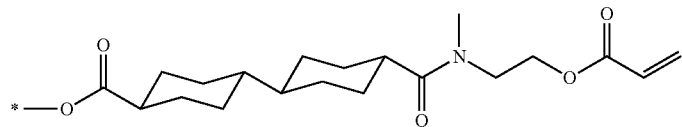 [SMILES: C=CC(=O)OCCN(C)C(=O)C1CCC(C2CCC(C(=O)OC)CC2)CC1] |
| 1-10 | 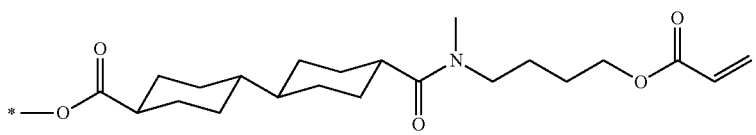 [SMILES: C=CC(=O)OCCCCN(C)C(=O)C1CCC(C2CCC(C(=O)OC)CC2)CC1] |
| 1-11 | 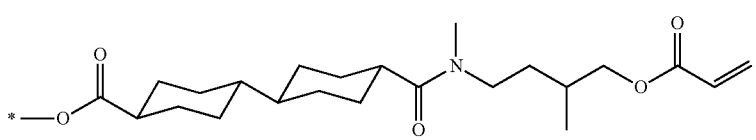 [SMILES: C=CC(=O)OCC(C)CCN(C)C(=O)C1CCC(C2CCC(C(=O)OC)CC2)CC1] |

TABLE 1-continued
| | K (side chain structure) |
|---|---|
| 1-12 | 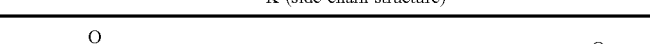 |
| 1-13 | |
TABLE 2
| | K (side chain structure) |
|---|---|
| 2-1 | 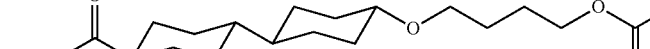 |
| 2-2 | |
| 2-3 | |
| 2-4 | |
| 2-5 | |
| 2-6 | |
| 2-7 | |

TABLE 2-continued

K (side chain structure)

2-8

2-9

2-10

2-11

2-12

2-13

(Specific Acidic Compound)

The specific acidic compound contained in the polymerizable liquid crystal composition of the embodiment of the present invention is an acidic compound having a pKa of more than −10 to 5 or less.

Here, the pKa is an acid dissociation constant, and a lower value thereof indicates a higher acid strength.

In the present specification, the pKa is calculated based on the following procedures (i) to (v). That is, in a case where the pKa of the specific acidic compound can be calculated according to (i), the calculated pKa according to (i) is taken as the pKa of the specific acidic compound. In a case where the pKa cannot be calculated according to (i), an attempt is made to calculate the pKa according to (ii), and in a case where the pKa can be calculated according to (ii), the value is taken as the pKa of the specific acidic compound. In a case where the pKa cannot be calculated according to (ii), an attempt is made to calculate the pKa according to (iii), and in a case where the pKa can be calculated according to (iii), the value is defined as the pKa of the specific acidic compound. Further, in a case where the pKa cannot be calculated according to (iii), an attempt is made to calculate the pKa according to (iv), and a value at which the pKa can be calculated according to (iv) is taken as the pKa of the specific acidic compound. In addition, in a case where the pKa cannot be calculated according to (iv), an attempt is made to calculate the pKa according to (v), and a value at which the pKa can be calculated by (v) is taken as the pKa of the specific acidic compound.

(i) Using the following software package 1, a pKa value based on Hammett's substituent constants and a database of values in known literature are determined by calculation.

Software Package 1>

Marvin Sketch 18.3 (ChemAxon)

The pKa of a compound which can be calculated by the software package 1 is used after rounding off the second decimal place.

(ii) With respect to a compound of which pKa cannot be calculated by the software package 1, the pKa is determined using a software package 2.

<Software Package 2>

Advanced Chemistry Development (ACD/Labs) Software V8.14 for Solaris (1994-2007 ACD/Labs).

The pKa of a compound, which can be calculated by the software package 2, is used after rounding off the second decimal place.

(iii) With respect to a superstrong acid for which the value cannot be calculated by the software package 2 (a hypervalent compound including a boron atom or a phosphorus atom, for which the value cannot be calculated due to a problem of a program), reference can be made to pKa (DCE) described in Table 1 in Reference 1 (J. Org. Chem., 2011, 76, 391). Here, DCM means a pKa in a 1,2-dichloroethane solvent.

(iv) With respect to a superstrong acid which is not even described in Reference 1, the pKa is calculated with reference to "Fluoride ion affinity of the Lewis Acid [kJ/mol]" described in Table 3 of Reference 2 (Anger. Chem., Int. Ed., 2004, 43, 2066).

That is, the pKa is calculated by multiplying a conversion coefficient (−10.3/338) derived from proportional calculation of a pKa (−10.3) and Fluoride ion affinity of the Lewis Acid (338) of "HBF$_4$" described in both References 1 and 2 by the value of Fluoride ion affinity of the Lewis Acid of each component described in Reference 2. For example, since the value of Fluoride ion affinity of the Lewis Acid of [PF$_6$]$^-$ in Table 3 of Reference 2 is 394, the pKa of HPF$_6$ can be calculated to be 394×(−10.3/338)=−12.0.

(v) With respect to a superstrong acid for which the value cannot be calculated according to (i) to (iv) above and compounds not described in References 1 and 2, the value is defined as a value equivalent to a compound having a similar structure in the present invention.

In the present invention, the pKa of the specific acidic compound is preferably −5 to 5, and more preferably −2 to 3 for a reason that the durability is further improved.

Furthermore, in the present invention, the molecular weight of the specific acidic compound is preferably 120 or more, more preferably 120 or more and 500 or less, and still more preferably 150 or more and 350 or less for a reason that it is difficult to volatilize during the formation of the optically anisotropic film and the durability is further improved.

Specific examples of such a specific acidic compound include compounds shown in Table 3 below.

TABLE 3

| | Structural formula | pKa | Molecular weight | Calculation method |
|---|---|---|---|---|
| A-1 | | 5.0 | 170.3 | (i) |
| A-2 | | 4.2 | 164.8 | (i) |
| A-3 | | 2.1 | 211.09 | (i) |
| A-4 | | −2.1 | 172.02 | (i) |
| A-5 | | 2.2 | 158.01 | (i) |
| A-6 | | 1.6 | 235.92 | (i) |
| A-7 | | 2.1 | 174.01 | (i) |
| A-8 | | 1.9 | 322.23 | (i) |

TABLE 3-continued

| | Structural formula | pKa | Molercular weight | Calculation method |
|---|---|---|---|---|
| A-9 | bis(2-ethylhexyl) phosphate | 0.9 | 250.04 | (i) |
| A-10 | camphorsulfonic acid | −0.8 | 232.08 | (i) |
| A-11 | dibutyl phosphate | 1.9 | 210.1 | (i) |
| A-12 | 3-cyanobenzoic acid | 3.9 | 147.13 | (i) |
| A-13 | 4-methoxybenzoic acid | 4.4 | 152.15 | (i) |
| A-15 | citric acid | 3.1 | 192.12 | (i) |

Furthermore, in the present invention, the specific acidic compound is preferably at least one compound selected from the group consisting of a phosphoric acid compound, a phosphonic acid compound, and a sufonic acid compound, and more preferably the phosphonic acid compound or the sulfonic acid compound for a reason that the durability is further improved.

In the present invention, the content of the specific acidic compound is 20 parts by mass or less, preferably 0.05 to 20 parts by mass, more preferably 0.1 to 10 parts by mass, and still more preferably 0.2 to 5 parts by mass, with respect to 100 parts by mass of the polymerizable liquid crystal compound (1).

In addition, in a case where the polymerizable liquid crystal composition of the embodiment of the present invention contains another polymerizable compound which will be described later, the above-mentioned content of the specific acidic compound refers to a content (parts by mass) with respect to 100 parts by mass of the compound in the polymerizable liquid crystal compound (1) and such another polymerizable liquid crystal compound.

Particularly, for a reason that the durability is further improved, the value of the pKa of the specific acidic compound and the value of the content (parts by mass) of the specific acidic compound with respect to 100 parts by mass of the polymerizable liquid crystal compound (1) preferably satisfies Expression (I), more preferably satisfies Expression (Ia), still more preferably satisfies Expression (Ib), and particularly preferably satisfies Expression (Ic).

$$0.01 \leq \text{Value of content}/(\text{Value of pKa}+10) \leq 1.5 \quad (I).$$

$$0.03 \leq \text{Value of content}/(\text{Value of pKa}+10) \leq 1.0 \quad (Ia)$$

$$0.05 \leq \text{Value of content}/(\text{Value of pKa}+10) \leq 0.8 \quad (Ib)$$

$$0.1 \leq \text{Value of content}/(\text{Value of pKa}+10) \leq 0.6 \quad (Ic)$$

Other Polymerizable Compounds

The polymerizable liquid crystal composition of the embodiment of the present invention may include other polymerizable compounds having one or more polymerizable groups, in addition to the above-mentioned polymerizable liquid crystal compound (I) and polymerizable compound (II).

Here, the polymerizable group which is contained in such other polymerizable compounds is not particularly limited, and examples thereof include an acryloyl group, a methacryloyl group, a vinyl group, a styryl group, and an allyl group. Among those, such other polymerizable compounds preferably have the acryloyl group or the methacryloyl group.

For a reason that the moisture-heat resistance of an optically anisotropic film thus formed is further improved, such other polymerizable compounds are preferably other polymerizable compounds having 1 to 4 polymerizable groups, and more preferably other polymerizable compounds having two polymerizable groups.

Examples of such other polymerizable compounds include the compounds described in paragraphs [0073] and [0074] of JP2016-053709A.

Furthermore, other examples of such other polymerizable compounds include the compounds represented by Formulae (M1), (M2), and (M3) described in paragraphs [0030] to [0033] of JP2014-077068A, and more specifically, the specific examples described in paragraphs [0046] to [0055] of the same publication.

In addition, as such other polymerizable compounds, the compounds having the structures of Formulae (1) to (3) described in JP2014-198814A can also be preferably used, and more specifically, examples of such other polymerizable compounds include the specific examples described in paragraphs [0020] to [0035], [0042] to [0050], [0056], and [0057] of the same publication.

In a case where such other polymerizable compounds are contained, a content thereof is preferably less than 50% by mass, more preferably 40% by mass or less, and still more preferably 2% to 30% by mass, with respect to a total mass including the above-mentioned polymerizable liquid crystal compound (I) and polymerizable compound (II).

Polymerization Initiator

The polymerizable liquid crystal composition of the embodiment of the present invention preferably contains a polymerization initiator.

The polymerization initiator to be used is preferably a photopolymerization initiator capable of initiating a polymerization reaction upon irradiation with ultraviolet rays (UV).

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

In addition, in the present invention, it is also preferable that the polymerization initiator is an oxime-type polymerization initiator, and specific examples of the polymerization initiator include the initiators described in paragraphs [0049] to [0052] of WO2017/170443A.

Solvent

It is preferable that the polymerizable liquid crystal composition of the embodiment of the present invention contains a solvent from the viewpoint of workability for forming an optically anisotropic film, and the like.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

Leveling Agent

It is preferable that the polymerizable liquid crystal composition of the embodiment of the present invention contains a leveling agent from the viewpoint that the surface of an optically anisotropic film is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Specific example of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). In addition, the leveling agent may also function as an alignment control agent which will be described later.

Alignment Control Agent

The polymerizable liquid crystal composition of the embodiment of the present invention can contain an alignment control agent, as desired.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent or a high-molecular-weight alignment control agent can be used.

With regard to the low-molecular-weight alignment control agent, reference can be made to the description in, fir example, paragraphs [0009] to [0083] of JP2002-020363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Furthermore, examples of the alignment control agent that forms or accelerates the homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are hereby incorporated by reference.

On the other hand, the cholesteric alignment can be achieved by adding a chiral agent to the polymerizable liquid crystal composition of the embodiment of the present invention, and it is possible to control the direction of revolution of the cholesteric alignment by its chiral direction. Incidentally, it is possible to control the pitch of the cholesteric alignment in accordance with the alignment regulating force of the chiral agent.

In a case where an alignment control agent is contained, a content thereof is preferably 0.01% to 10% by mass, and more preferably 0.05% to 5% by mass, with respect to the mass of the total solid content of the polymerizable liquid crystal composition. In a case where the content is within the range, it is possible to obtain an optically anisotropic film which has no precipitation or phase separation, alignment defects, or the like, and is uniform and highly transparent while achieving a desired alignment state.

These alignment control agents can further impart a polymerizable functional group, in particular, a polymerizable functional group which is polymerizable with a polymerizable liquid crystal compound constituting the polymerizable liquid crystal composition of the embodiment of the present invention.

Other Components

The polymerizable liquid crystal composition of the embodiment of the present invention may contain components other than the above-mentioned components, and examples of such other components include a liquid crystal compound other than the above-mentioned polymerizable liquid crystal compound, a surfactant, a tilt angle control agent, an alignment aid, a plasticizer, and a crosslinking agent.

Optically Anisotropic Film

An optically anisotropic film of an embodiment of the present invention is an optically anisotropic film obtained by polymerizing the above-mentioned polymerizable liquid crystal composition of the embodiment of the present invention.

Examples of a method for forming the optically anisotropic film include a method in which the above-mentioned polymerizable liquid crystal composition of the embodiment of the present invention is used to cause a desired alignment state, which is then fixed by polymerization.

Here, the polymerization conditions are not particularly limited, but in the polymerization by irradiation with light, ultraviolet rays are preferably used. The irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 mJ/cm$^2$ to 1,000 mJ/cm$^2$. In addition, the polymerization may be carried out under a heating condition in order to accelerate the polymerization reaction.

In addition, in the present invention, the optically anisotropic film can be formed on any of supports in the optical film of the embodiment of the present invention which will be described later or a polarizer in the polarizing plate of an embodiment of the present invention which will be described later.

In the present invention, it is preferable that the polymerizable liquid crystal compound included in the above-mentioned polymerizable liquid crystal composition of the embodiment of the present invention is in state where it is horizontally aligned after polymerization for a reason that an optically anisotropic film thus formed functions as a positive A-plate.

Here, the positive A-plate is defined as follows.

In a case where a refractive index in a film in-plane slow axis direction (in a direction in which an in-plane refractive index is maximum) is defined as nx, a refractive index in an in-plane direction perpendicular to the in-plane slow axis is defined as ny, and a thickness-direction refractive index is defined as nz, the positive A-plate satisfies the relationship of Formula (A1). In addition, Rth of the positive A-plate indicates a positive value.

$$nx > ny \approx nz \qquad \text{Formula (A1)}$$

Furthermore, the symbol, "≈" encompasses not only a ease where the both are completely the same as each other but also a case where the both are substantially the same as each other. The expression, "substantially the same", means that for example, a case where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz".

The optically anisotropic film of the embodiment of the present invention preferably satisfies the following Formula (II).

$$0.50 < Re(450)/Re(550) < 1.00 \qquad (II)$$

Here, in Formula (II), Re(450) represents an in-plane retardation of the optically anisotropic film at a wavelength of 450 nm, and Re(550) represents an in-plane retardation of the optically anisotropic film at a wavelength of 550 nm. Incidentally, in the present specification, in a case where the measurement wavelength of the retardation is not specified, the measurement wavelength is 550 nm.

Furthermore, the values of the in-plane retardation and the thickness-direction retardation refer to values measured with light at the measurement wavelength using AxoScan OPMF-1 (manufactured by Opto Science, Inc.).

Specifically, by inputting the average refractive index ((Nx+Ny+Nz)/3) and the film thickness (d (µm)) to AxoScan OPMF-1, it is possible to calculate:

Slow axis direction (°)

$$Re(\lambda) = R0(\lambda)$$

$$Rth(\lambda) = ((nx+ny)/2 - nz) \times d.$$

In addition, R0(λ) is expressed in a numerical value calculated with AxoScan OPMF-1, but means Re(λ).

Optical Film

The optical film of the embodiment of the present invention is an optical film having the optically anisotropic film of the embodiment of the present invention.

Figure 1B:
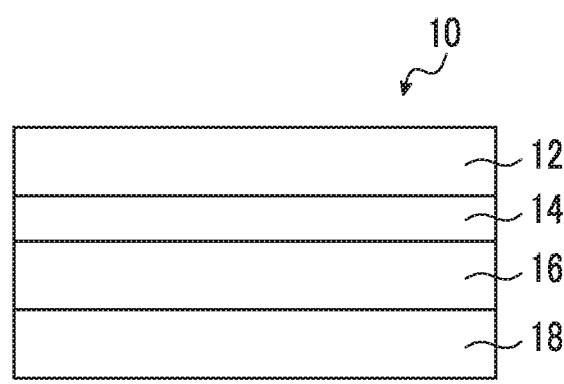
FIG. 1B is a schematic cross-sectional view showing another example of the optical film of the embodiment of the present invention.
Figure 1C:
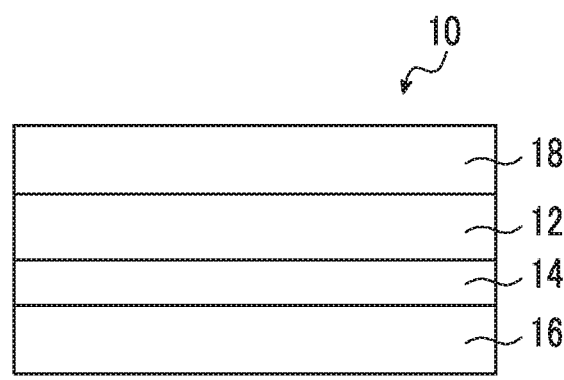
FIG. 1C is a schematic cross-sectional view showing still another example of the optical film of the embodiment of the present invention.

FIG. 1A, FIG. 1B, and FIG. 1C (these drawings are hereinafter simply referred to as "FIG. 1" unless it is necessary that they are particularly distinguished from each other) are each a schematic cross-sectional view showing an example of the optical film of the embodiment of the present invention.

Furthermore, FIG. 1 is a schematic view, and the thicknesses relationship, the positional relationship, and the like among the respective layers are not necessarily consistent with actual ones, and any of the support, the alignment film, and the hard coat layer shown in FIG. 1 are optional constitutional members.

An optical film 10 shown in FIG. 1 has a support 16, an alignment film 14, and an optically anisotropic film 12 in this order.

In addition, the optical film 10 may have a hard coat layer 18 on the side of the support 16 opposite to the side on which the alignment film 14 is provided as shown in FIG. 1B, and may have the hard coat layer 18 on the side of the optically anisotropic film 12 opposite to the side on which the alignment film 14 is provided as shown in FIG. 1C.

Hereinafter, various members used for the optical film of the embodiment of the present invention will be described in detail.

Optically Anisotropic Film

The optically anisotropic film which the optical film of the embodiment of the present invention has is the above-mentioned optically anisotropic film of the embodiment of the present invention.

In the optical film of the embodiment of the present invention, the thickness of the optically anisotropic film is not particularly limited, but is preferably 0.1 to 10 μm, and more preferably 0.5 to 5 μm.

Support

The optical film of the embodiment of the present invention may have a support as a base material for forming an optically anisotropic film as described above.

Such a support is preferably transparent, and specifically, it preferably has a light transmittance of 80% or more.

Examples of such a support include a glass substrate and a polymer film, and examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

In the present invention, the thickness of the support is not particularly limited, but is preferably 5 to 60 μm, and more preferably 5 to 30 μm.

Alignment Film

In a case where the optical film of the embodiment of the present invention has any of the above-mentioned supports, it is preferable that the optical film has an alignment film between the support and the optically anisotropic film. Further, an aspect in which the above-mentioned support may also function as an alignment film is also available.

The alignment film generally has a polymer as a main component. The materials for the polymer material for an alignment film are described in many documents, and many commercially available products can be used.

The polymer material used in the present invention is preferably a polyvinyl alcohol or a polyimide, or a derivative thereof. Particularly, a modified or non-modified polyvinyl alcohol is preferable.

Examples of the alignment film that can be used in the present invention include the alignment films described for Line 24 on Page 43 to Line 8 on Page 49 of WO/01/088574A; the modified polyvinyl alcohols described in paragraphs [0071] to [0095] of JP3907735B; and the liquid crystal alignment film formed by a liquid crystal aligning agent described in JP2012-155308A.

In the present invention, for a reason that it is possible to prevent deterioration in the surface condition by avoiding a contact with the surface of an alignment film upon formation of the alignment film, a photo-alignment film is also preferably used as the alignment film.

The photo-alignment film is not particularly limited, but the polymer materials such as a polyimide compound and a polyimide compound, described in paragraphs 0024 to 0043 of WO2005/096041A; the liquid crystal alignment film formed by a liquid crystal aligning agent having a photo-alignment group, described in JP2012-155308A; LPP-JP265CP, trade name, manufactured by Rolic Technologies Ltd.; or the like can be used.

In addition, in the present invention, the thickness of the alignment film is not particularly limited, but from the viewpoint of forming an optically anisotropic film having a homogeneous film thickness by alleviating the surface roughness that can be present on the support, the thickness is preferably 0.01 to 10 μm, more preferably 0.01 to 1 μm, and still more preferably 0.01 to 0.5 μm.

Hard Coat Layer

It is preferable that the optical film of the embodiment of the present invention has a hard coat layer in order to impart physical strength to the film. Specifically, the optical film may have the hard coat layer on the side of the support opposite to the side on which the alignment film is provided (see FIG. 1B) or the optical film may have the hard coat layer on the side of the optically anisotropic film opposite to the side on which the alignment film is provided (see FIG. 1C).

As the hard coat layer, those described in paragraphs [0190] to [0196] of JP2009-098658A can be used.

Other Optically Anisotropic Films

The optical film of the embodiment of the present invention may have other optically anisotropic films, in addition to the optically anisotropic film of the embodiment of the present invention.

That is, the optical film of the embodiment of the present invention may have a laminated structure having the optically anisotropic film of the embodiment of the present invention and other optically anisotropic films.

Such other optically anisotropic films are not particularly limited as long as the optically anisotropic films are obtained by not blending any one of the polymerizable liquid crystal compound (I) and the polymerizable compound (II), but using the above-mentioned other polymerizable compounds (in particular, liquid crystal compounds).

Here, the liquid crystal compounds can be generally classified into a rod-shaped type and a disk-shaped type according to the shape thereof. Each of the types can further be classified into a low-molecular-weight type and a high-molecular-weight type. The term, high-molecular-weight, generally refers to having a degree of polymerization of 100 or more (Polymer Physics-Phase Transition Dynamics, by Masao Doi, page 2, published by Iwanami Shoten, Publishers, 1992). In the present invention, any of the liquid crystal compounds can be used, but the rod-shaped liquid crystal compound or the discotic liquid crystal compound (disk-shaped liquid crystal compound) is preferably used. Two or more kinds of the rod-shaped liquid crystal compounds, two or more kinds of the disk-shaped liquid crystal compounds, or a mixture of the rod-shaped liquid crystal compound and the disk-shaped liquid crystal compound may be used. In order to fix the above-mentioned liquid crystal compound, it is more preferable that the liquid crystal compound is formed of a rod-shaped liquid crystal compound or disk-shaped liquid crystal compound having a polymerizable group, and it is still more preferable that the liquid crystal compound has two or more polymerizable groups in one molecule. In the case of a mixture of two or more kinds of the liquid crystal compounds, at least one kind of the liquid crystal compound preferably has two or more polymerizable groups in one molecule.

As the rod-shaped liquid crystal compound, for example, the rod-shaped liquid crystal compounds described in claim 1 of JP1999-513019A (JP-H11-513019A) or paragraphs [00260] to [0098] of JP2005-289980A can be preferably used, and as the discotic liquid crystal compound, for example, the discotic liquid crystal compounds described in paragraphs [00200] to [0067] of JP2007-108732A and paragraphs [0013] to [0108] of JP2010-244038A can be preferably used, but the liquid crystal compounds are not limited thereto.

Ultraviolet Absorber

The optical film of the embodiment of the present invention preferably includes an ultraviolet (UV) absorber, taking an effect of external light (particularly ultraviolet rays) into consideration.

The ultraviolet absorber may be contained in the optically anisotropic film of the embodiment of the present invention or may also be contained in a member other than an optically anisotropic film constituting the optical film of the embodiment of the present invention. Suitable examples of the member other than the optically anisotropic film include a support.

As the ultraviolet absorber, any one of ultraviolet absorbers known in the related art, which can express ultraviolet absorptivity, can be used. Among such ultraviolet absorbers, a benzotriazole-based or hydroxyphenyltriazine-based ultraviolet absorber is preferably used from the viewpoint that it has high ultraviolet absorptivity and ultraviolet absorbing ability (ultraviolet-shielding ability) used for an image display device is obtained.

In addition, in order to broaden ultraviolet absorbing ranges, two or more of ultraviolet absorbers having different maximum absorption wavelengths can be used in combination.

Specific examples of the ultraviolet absorber include the compounds described in paragraphs [0258] and [0259] of JP2012-018395A and the compounds described in paragraphs [0055] to [0105] of JP2007-072163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

Polarizing Plate

A polarizing plate of an embodiment of the present invention has the above-mentioned optical film of the embodiment of the present invention and a polarizer.

Polarizer

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dyeing in a state of a laminated film in which a polyvinyl alcohol layer is formed on a base material include the methods disclosed in JP5048120B, JP143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range and a ¼ wavelength plate, or the like is used as the reflective type polarizer.

Among those, a polarizer including a polyvinyl alcohol-based resin (a polymer including —$CH_2$—CHOH— as a repeating unit, in particular, at least one selected from the group consisting of a polyvinyl alcohol and an ethylene-vinyl alcohol copolymer) is preferable from the viewpoint that it has more excellent adhesiveness.

In the present invention, the thickness of the polarizer is not particularly limited, but is preferably 3 µm to 60 µm, more preferably 5 µm to 30 µm, and still more preferably 5 µm to 15 µm.

Pressure-Sensitive Adhesive Layer

The polarizing plate of the embodiment of the present invention may have a pressure-sensitive adhesive layer arranged between the optically anisotropic film in the optical film of the embodiment of the present invention and the polarizer.

The pressure-sensitive adhesive layer used for lamination of the optically anisotropic film and the polarizer represents, for example, a substance in which a ratio (tan δ=G"/G') between a storage elastic modulus G' and a loss elastic modulus G", each measured with a dynamic viscoelastometer, is 0.001 to 1.5, and examples thereof include a so-called pressure-sensitive adhesive or a readily creepable substance. Examples of the pressure-sensitive adhesive that can be used in the present invention include a polyvinyl alcohol-based pressure-sensitive adhesive, but the pressure-sensitive adhesive is not limited thereto.

Image Display Device

An image display device of an embodiment of the present invention is an image display device having the optical film of the embodiment of the present invention or the polarizing plate of the embodiment of the present invention.

A display element used in the image display device of the embodiment of the present invention is not particularly limited, and examples thereof include a liquid crystal cell, an organic electroluminescent (hereinafter simply referred to as "EL") display panel, and a plasma display panel.

Among those, the liquid crystal cell and the organic EL display panel are preferable, and the liquid crystal cell is more preferable. That is, as the image display device of embodiment of the present invention, a liquid crystal display device using a liquid crystal cell as a display element or an organic EL display device using an organic EL display panel as a display element is preferable, and the liquid crystal display device is more preferable.

Liquid Crystal Display Device

A liquid crystal display device which is an example of the image display device of the embodiment of the present invention is a liquid crystal display device having the above-mentioned polarizing plate of the embodiment of the present invention and a liquid crystal cell.

In addition, in the present invention, it is preferable that the polarizing plate of the embodiment of the present invention is used as the polarizing plate of the front side, and it is more preferable that the polarizing plate of the embodiment of the present invention is used as the polarizing plates on the front and rear sides, among the polarizing plates provided on the both sides of the liquid crystal cell.

Hereinafter, the liquid crystal cell constituting the liquid crystal display device will be described in detail.
<Liquid Crystal Cell>

A liquid crystal cell for use in the liquid crystal display device is preferably in a vertical alignment (VA) mode, an optically compensated bend (OCB) mode, an in-plane-switching (IPS) mode, or a twisted nematic (TN) mode, but the liquid crystal cell is not limited thereto.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents, In a VA-mode liquid crystal cell, rod-shaped liquid crystal molecules are substantially vertically aligned during no voltage application thereto. Examples of the VA-mode liquid crystal cell include (1) a V/A-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA mode is multi-domained for viewing angle enlargement (described in SID97, Digest of Tech. Papers (preprint), 28 (1997) 845), (3) a liquid crystal cell in a mode (n-ASM mode) in which rod-shaped liquid crystal molecules are substantially vertically aligned during no voltage application thereto and are multi-domain-aligned during voltage application thereto (described in Seminar of Liquid Crystals of Japan, Papers (preprint), 58-59 (1998)), and (4) a survival-mode liquid crystal cell (announced in LCD International 98). In addition, the liquid crystal cell may be of any of a patterned vertical alignment (PVA) type, an optical alignment type, and polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP1998-054982A (JP-H10-054982A), JP 1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

Organic EL Display Device

Suitable examples of the organic EL display device which is an example of the image display device of the embodiment of the present invention include an aspect which includes, from the visible side, the polarizing plate of the embodiment of the present invention, a plate having a λ/4 function (hereinafter also referred to as a "λ/4 plate"), and an organic EL display panel in this order.

Here, the "plate having a λ/4 function" refers to a plate having a function of converting linearly polarized light at a specific wavelength into circularly polarized light (or converting circularly polarized light into linearly polarized light), specific examples of the plate in which the λ/4 plate is a single-layer structure include a stretched polymer film, and a phase difference film provided with an optically anisotropic film having a λ/4 function on a support, and specific examples of an aspect in which the λ/4 plate is a multilayer structure include a broadband λ/4 plate obtained by laminating a λ/4 plate and a λ/2 plate.

Furthermore, the organic EL display panel is a display panel composed of an organic EL element in which an organic light emitting layer (organic electroluminescent layer) is sandwiched between electrodes (between a cathode and an anode). The configuration of the organic EL display panel is not particularly limited but a known configuration is adopted.

EXAMPLES

Hereinafter, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

Example 1

<Manufacture of Polarizer 1 with Photo-Alignment Film 1>

A support surface of a cellulose triacetate film TD80UL (manufactured by FUJIFILM Corporation) was subjected to an alkali saponification treatment. Specifically, the support was immersed in a 1.5 N aqueous sodium hydroxide solution at 55° C. for 2 minutes, then washed in a water-washing bathtub at room temperature, and neutralized with 0.1 N sulfuric acid at 30° C. After the neutralization, the support was washed in a water-washing bathtub at room temperature and further dried with hot air at 100° C.

Then, a roll-shaped polyvinyl alcohol film having a thickness of 80 μm was continuously stretched 5 times in the machine direction (MD) direction in an aqueous iodine solution and dried to obtain a polarizer (polarizing film) having a thickness of 20 μm.

Next, the cellulose triacetate film TD80UL which had been subjected to the alkali saponification treatment as a polarizer protective film was bonded to one surface of the polarizer.

Thereafter, a coating liquid 1 for a photo-alignment film having the same formulation as that of the liquid crystal alignment agent (S-3) described in Example 3 of JP2012-155308A was prepared and applied onto the other surface of the polarizer a wire bar. The film was dried with hot air at 60° C. for 60 seconds to produce a polarizer 1 with a photo-alignment film 1.

<Manufacture of Polarizing Plate 1>

A coating liquid A-1 for forming a positive A-plate A-1 having the following formulation was prepared.

| Formulation of coating liquid A-1 for forming positive A-plate A-1 | |
|---|---|
| The following polymerizable liquid crystal compound L-1 | 40.00 parts by mass |
| The following polymerizable liquid crystal compound L-2 | 40.00 parts by mass |
| The following polymerizable compound X-1 | 20.00 parts by mass |
| The following polymerization initiator S-1 | 3.00 parts by mass |
| The following specific acidic compound A-1 | 0.50 parts by mass |
| Leveling agent (the following compound T-1) | 0.10 parts by mass |
| Methyl ethyl ketone (solvent) | 200.00 parts by mass |
| Cyclopentanone (solvent) | 200.00 parts by mass |

Furthermore, a group adjacent to the acryloyloxy group in each of Formulae L-1 and L-2 represents a propylene group (a group in which a methyl group is substituted by an ethylene group), and the polymerizable liquid crystal compounds L-1 and L-2 each represent a mixture of position isomers in which the positions of the methyl groups are different.

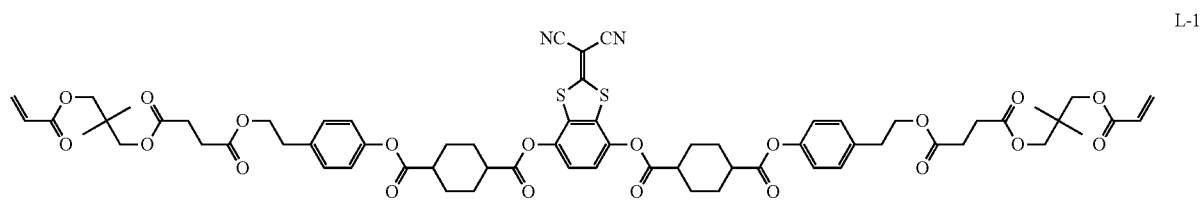

L-1

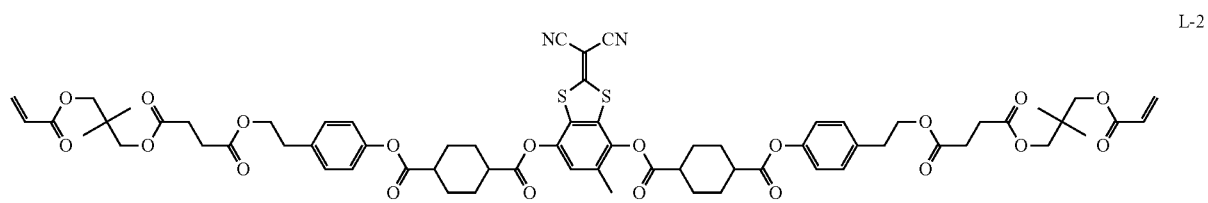

L-2

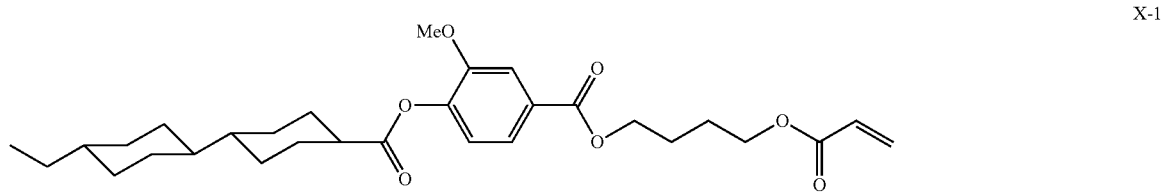

X-1

S-1

A-1

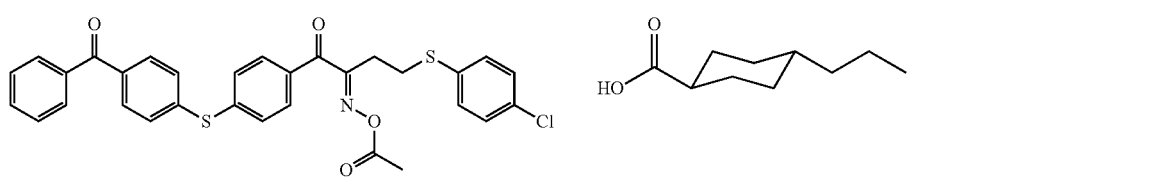

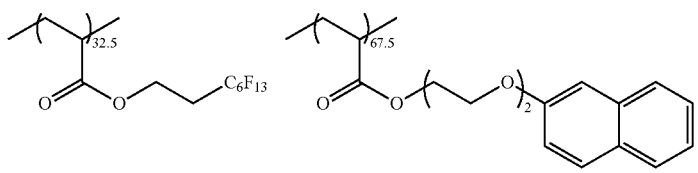

T-1

The manufactured polarizer 1 with the photo-alignment film 1 was irradiated with ultraviolet rays using an ultra-high pressure mercury lamp in the atmosphere. At this Erne, a wire grid polarizer (ProFlux PPL02, manufactured by Moxtek, Inc.) was set so as to be parallel to the surface of the photo-alignment film 1, exposed, and subjected to a photo-alignment treatment. An illuminance of the ultraviolet rays used herein was set to 10 mJ/cm$^2$ in the UV-A region (ultraviolet. A wave, an integration of wavelengths of 380 nm to 320 nm), Next, a coating liquid A-1 for forming a positive A-plate A-1 was applied on the photo-alignment-treated surface using a bar coater. After aging the film by heating at a film surface temperature of 100° C. for 20 seconds and cooling to 55° C., the film was irradiated with ultraviolet rays at 300 mJ/cm$^2$ in the air using an air-cooling metal halide lamp (manufactured by EYEGRAPHICS Co., Ltd.) to fix the alignment state, thereby forming a polarizing plate 1. That is, the obtained polarizing plate 1 had the positive A-plate A-1 as an optically anisotropic film (phase difference film), the photo-alignment film 1, the polarizer 1, and the polarizer protective film, which were arranged in this order.

In the positive A-plate A-1 thus formed, the slow axis direction was vertical to the absorption axis of the polarizing plate (that is, the polymerizable liquid crystal compound was aligned vertically to the absorption axis of the polarizing plate). With respect to the positive A-plate A-1, the dependency of Re on the light incidence angle and the tilt angle of the optical axis were measured using AxoScan OPMF-1 (manufactured by Opto Science, Inc.), and Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously (horizontally) aligned.

Example 2

A polarizing plate 2 of Example 2 was manufactured by the same method as in Example 1, except that the blending amount of the specific acidic compound A-1 was changed to 2.00 parts by mass. Furthermore, in the following description, the optically anisotropic film (phase difference film) included in the polarizing plate 2 is referred to as a "positive A-plate A-2".

In a case where the optical characteristics of the positive A-plate A-2 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 3

A polarizing plate 3 of Example 3 was manufactured by the same method as in Example 1, except that 0.50 parts by mass of a specific acidic compound A-2 represented by Formula A-2 was used instead of the specific acidic compound A-1. Furthermore, in the following description, the optically anisotropic film (phase difference film) included in the polarizing plate 3 is referred to as a "positive A-plate A-3".

In a case where the optical characteristics of the positive A-plate A-3 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

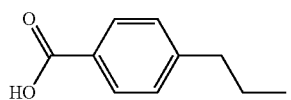

A-2

Example 4

A polarizing plate 4 of Example 4 was manufactured by the same method as in Example 3, except that the blending amount of the specific acidic compound A-2 was changed to 2.00 parts by mass. Furthermore, in the following description, the optically anisotropic film (phase difference film) included in the polarizing plate 4 is referred to as a "positive A-plate A-4".

In a case where the optical characteristics of the positive A-plate A-4 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 5

A polarizing plate 5 of Example 5 was manufactured by the same method as in Example 1, except that 0.50 parts by mass of a specific acidic compound A-3 represented by Formula A-3 was used instead of the specific acidic compound A-1. Furthermore, in the following description, the optically anisotropic film (phase difference film) included in the polarizing plate 5 is referred to as a "positive A-plate A-5".

In a case where the optical characteristics of the positive A-plate A-5 were measured, Re and Rth at a wavelength of 550 nm were 145 nm and 73 nm, respectively, Re(550)/Re(450) was 1.12. Re(650)/Re(550) was 1.01, the tilt angle of the optical axis was 0°, and the polymerizable liquid crystal compound was homogeneously aligned.

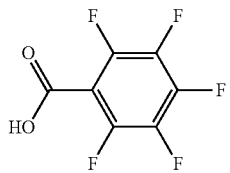 [SMILES: O=C(O)c1c(F)c(F)c(F)c(F)c1F]

A-3

Example 6

A polarizing plate 6 of Example 6 was manufactured by the same method as in Example 5, except that the blending amount of the specific acidic compound A-3 was changed to 2.00 parts by mass. Furthermore, in the following description, the optically anisotropic film (phase difference film) included in the polarizing plate 6 is referred to as a "positive A-plate A-6".

In a case where the optical characteristics of the positive A-plate A-6 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 7

A polarizing plate 7 of Example 7 was manufactured by the same method as in Example 1, except that 0.50 parts by mass of a specific acidic compound A-4 represented by Formula A-4 was used instead of the specific acidic compound A-1. Furthermore, in the following description, the optically anisotropic film (phase difference film) included in the polarizing plate 7 is referred to as a "positive A-plate A-7".

In a case where the optical characteristics of the positive A-plate A-7 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

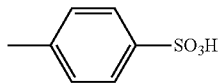

A-4

Example 8

A polarizing plate 8 of Example 8 was manufactured by the same method as in Example 7, except that the blending amount of the specific acidic compound A-4 was changed to 2.00 parts by mass. Furthermore, in the following description, the optically anisotropic film (phase difference film) included in the polarizing plate 8 is referred to as a "positive A-plate A-8".

In a case where the optical characteristics of the positive A-plate A-8 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 9

A polarizing plate 9 of Example 9 was manufactured by the same method as in Example 1, except that 0.50 parts by mass of a specific acidic compound A-5 represented by Formula A-5 was used instead of the specific acidic compound A-1. Furthermore, in the following description, the optically anisotropic film (phase difference film) included in the polarizing plate 9 is referred to as a "positive A-plate A-9".

In a case where the optical characteristics of the positive A-plate A-9 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

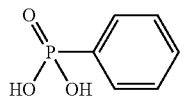

A-5

Example 10

A polarizing plate 10 of Example 10 was manufactured by the same method as in Example 9, except that the blending amount of the specific acidic compound A-5 was changed to 2.00 parts by mass. Furthermore, in the following description, the optically anisotropic film (phase difference film) included in the polarizing plate 10 is referred to as a "positive A-plate A-10".

In a case where the optical characteristics of the positive A-plate A-10 were measured, Re and Rth at a wavelength of 550 nm were 145 nm and 73 nm respectively, Re(550)/Re(450) was 1.12, Re(650)/Re(550) was 1.01, the tilt angle of the optical axis was 0°, and the polymerizable liquid crystal compound was homogeneously aligned.

Example 11

A polarizing plate 11 of Example 11 was manufactured by the same method as in Example 9, except that the blending amount of the specific acidic compound A-5 was changed to 5.00 parts by mass. Furthermore, in the following description, the optically anisotropic film (phase difference film) included in the polarizing plate 11 is referred to as a "positive A-plate A-11".

In a case where the optical characteristics of the positive A-plate A-11 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 12

A polarizing plate 12 of Example 12 was manufactured by the same method as in Example 1, except that 0.50 parts by mass of a specific acidic compound A-6 represented by Formula A-6 was used instead of the specific acidic compound A-1. Furthermore, in the following description, the optically anisotropic film (phase difference film) included in the polarizing plate 12 is referred to as a "positive A-plate A-12".

In a case where the optical characteristics of the positive A-plate A-12 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

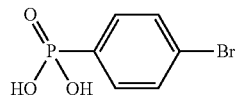

A-6

Example 13

A polarizing plate 13 of Example 13 was manufactured by the same method as in Example 12, except that the blending amount of the specific acidic compound A-6 was changed to 2.00 parts by mass. Furthermore, in the following description, the optically anisotropic film (phase difference film) included in the polarizing plate 13 is referred to as a "positive A-plate A-13".

In a case where the optical characteristics of the positive A-plate A-13 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 14

A polarizing plate 14 of Example 14 was manufactured by the same method as in Example 12, except that the blending amount of the specific acidic compound A-6 was changed to 5.00 parts by mass. Furthermore, in the following description, the optically anisotropic film (phase difference film) included in the polarizing plate 14 is referred to as a "positive A-plate A-14".

In a case where the optical characteristics of the positive A-plate A-14 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 15

A polarizing plate 15 of Example 15 was manufactured by the same method as in Example 1, except that 0.50 parts by mass of a specific acidic compound A-7 represented by Formula A-7 was used instead of the specific acidic compound A-1. Furthermore, in the following description, the optically anisotropic film (phase difference film) included in the polarizing plate 15 is referred to as a "positive A-plate A-15".

In a case where the optical characteristics of the positive A-plate A-15 were measured, Re and Rth at a wavelength of 550 nm were 145 min and 73 nm, respectively, Re(550)/Re(450) was 1.12, Re(650)/Re(550) was 1.01, the tilt angle of the optical axis was 0°, and the polymerizable liquid crystal compound was homogeneously aligned.

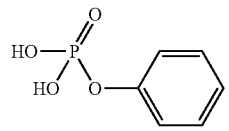 [SMILES: O=P(O)(O)Oc1ccccc1]

A-7

Example 16

A polarizing plate 16 of Example 16 was manufactured by the same method as in Example 15, except that the blending amount of the specific acidic compound A-7 was changed to 2.00 parts by mass. Furthermore, in the following description, the optically anisotropic film (phase difference film) included in the polarizing plate 16 is referred to as a "positive A-plate A-16".

In a case where the optical characteristics of the positive A-plate A-16 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 17

A polarizing plate 17 of Example 17 was manufactured by the same method as in Example 1, except that 0.50 parts by mass of a specific acidic compound A-8 represented by Formula A-8 was used instead of the specific acidic compound A-1. Furthermore, in the following description, the optically anisotropic film (phase difference film) included in the polarizing plate 17 is referred to as a "positive A-plate A-17".

In a case where the optical characteristics of the positive A-plate A-17 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

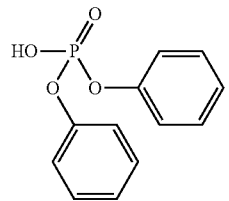 [SMILES: O=P(O)(Oc1ccccc1)Oc1ccccc1]

A-8

Example 18

A polarizing plate 18 of Example 18 was manufactured by the same method as in Example 17, except that the blending amount of the specific acidic compound A-8 was changed to 2.00 parts by mass. Furthermore, in the following description, the optically anisotropic film (phase difference film) included in the polarizing plate 18 is referred to as a "positive A-plate A-18".

In a case where the optical characteristics of the positive A-plate A-18 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 19

A polarizing plate 19 of Example 19 was manufactured by the same method as in Example 1, except that 0.50 parts by mass of a specific acidic compound A-9 represented by Formula A-9 was used instead of the specific acidic compound A-1. Furthermore, in the following description, the optically anisotropic film (phase difference film) included in the polarizing plate 19 is referred to as a "positive A-plate A-19".

In a case where the optical characteristics of the positive A-plate A-19 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

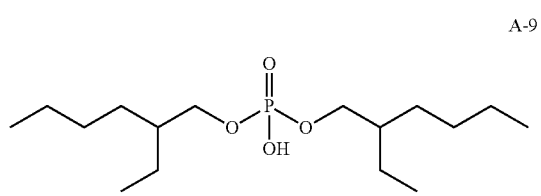 [SMILES: CCCCC(CC)COP(=O)(O)OCC(CC)CCCC]

A-9

Example 20

A polarizing plate 20 of Example 20 was manufactured by the same method as in Example 19, except that the blending amount of the specific acidic compound A-9 was changed to 2.00 parts by mass. Furthermore, in the following description, the optically anisotropic film (phase difference film) included in the polarizing plate 20 is referred to as a "positive A-plate A-20".

In a case where the optical characteristics of the positive A-plate A-20 were measured, Re and Rth at a wavelength of 550 nm were 145 nm and 73 nm, respectively, Re(550)/Re(450) was 1.12, Re(650)/Re(550) was 1.01, the tilt angle of the optical axis was and the polymerizable liquid crystal compound was homogeneously aligned.

Example 21

A polarizing plate 21 of Example 21 was manufactured by the same method as in Example 1, except that 0.50 parts by mass of a specific acidic compound A-10 represented by Formula A-10 was used instead of the specific acidic compound A-1. Furthermore, in the following description, the optically anisotropic film (phase difference film) included in the polarizing plate 21 is referred to as a "positive A-plate A-21".

In a case where the optical characteristics of the positive A-plate A-21 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

A-10

Example 22

A polarizing plate 22 of Example 22 was manufactured by the same method as in Example 9, except that the blending amount of the specific acidic compound A-5 was changed to 0.10 parts by mass. Furthermore, in the following description, the optically anisotropic film (phase difference film) included in the polarizing plate 22 is referred to as a "positive A-plate A-22".

In a case where the optical characteristics of the positive A-plate A-22 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 23

A polarizing plate 23 of Example 23 was manufactured by the same method as in Example 7, except that the blending amount of the specific acidic compound A-4 was changed to 12.00 parts by mass. Furthermore, in the following description, the optically anisotropic film (phase difference film) included in the polarizing plate 2.3 is referred to as a "positive A-plate A-23".

In a case where the optical characteristics of the positive A-plate A-23 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 24

A coating liquid A-24 for forming a positive A-plate A-24 having the following formulation was prepared with reference to the description of Example 1 in JP2012-021068A.

| Composition of coating liquid A-24 for forming positive A-plate A-24 | |
|---|---|
| The following polymerizable liquid crystal compound L-5 | 100.00 parts by mass |
| IRGACURE 369 (manufactured by BASF) | 3.00 parts by mass |
| OXE-03 (manufactured by BASF) | 3.00 parts by mass |
| ADEKA ARKLS NCI-831 (manufactured by ADEKA) | 3.00 parts by mass |
| The specific acidic compound A-5 | 0.50 parts by mass |
| Cyclopentanone (solvent) | 233.00 parts by mass |

Composition of coating liquid A-24 for forming positive A-plate A-24

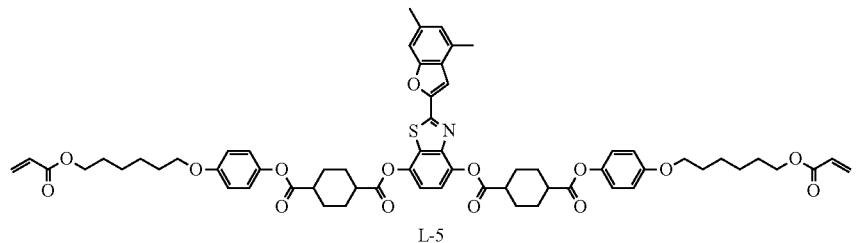 [SMILES: C=CC(=O)OCCCCCCOc1ccc(OC(=O)C2CCC(C(=O)Oc3ccc(OC(=O)C4CCC(C(=O)Oc5ccc(OCCCCCCOC(=O)C=C)cc5)CC4)c4sc(-c5cc6c(C)cc(C)cc6o5)nc34)CC2)cc1]

L-5

A polarizing plate 24 of Example 24 was manufactured by the same method as in Example 1, except that a coating liquid A-24 for forming a positive A-plate A-24 was used instead of the coating liquid A-1 for forming a positive A-plate A-1. Furthermore, in the following description, the optically anisotropic film (phase difference film) included in the polarizing plate 24 is referred to as a "positive A-plate A-24".

In a case where the optical characteristics of the positive A-plate A-22 were measured, Re and Rth at a wavelength of 550 nm were 145 nm and 73 nm, respectively, Re(550)/Re(450) was 1.18, Re(650)/Re(550) was 1.02, the tilt angle of the optical axis was 0.4°, and the polymerizable liquid crystal compound was homogeneously aligned.

Example 25

A polarizing plate 25 of Example 25 was manufactured by the same method as in Example 24, except that the blending amount of the specific acidic compound A-5 was changed to 2.00 parts by mass. Furthermore, in the following description, the optically anisotropic film (phase difference film) included in the polarizing plate 25 is referred to as a "positive A-plate A-25".

In a case where the optical characteristics of the positive A-plate A-25 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 26

A polarizing plate 26 of Example 26 was manufactured by the same method as in Example 24, except that the blending amount of the specific acidic compound A-5 was changed to 5.00 parts by mass. Furthermore, in the following description, the optically anisotropic film (phase difference film) included in the polarizing plate 26 is referred to as a "positive A-plate A-26".

In a case where the optical characteristics of the positive A-plate A-26 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 27

A polarizing plate 27 of Example 27 was manufactured by the same method as in Example 24, except that the following polymerizable liquid crystal compound L-7 was used instead of the polymerizable liquid crystal compound L-5. Furthermore, in the following description, the optically anisotropic film (phase difference film) included in the polarizing plate 27 is referred to as a "positive A-plate A-27".

In a case where the optical characteristics of the positive A-plate A-27 were measured, Re(550)/Re(450) was 1.20, Re(650)/Re(550) was 1.05, the tilt angle of the optical axis was 0°, and the polymerizable liquid crystal compound was homogeneously aligned.

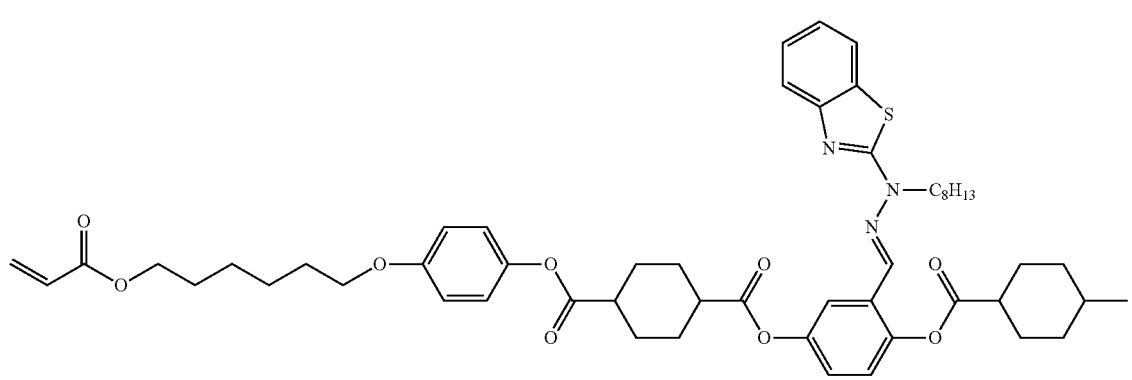

L-7

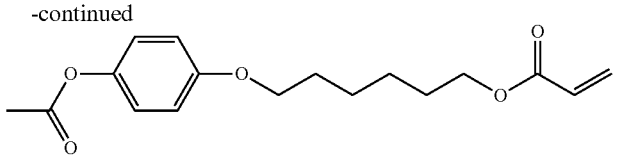

Example 28

A polarizing plate 28 of Example 28 was manufactured by the same method as in Example 27, except that the blending amount of the specific acidic compound A-5 was changed to 2.00 parts by mass. Furthermore, in the following description, the optically anisotropic film (phase difference film) included in the polarizing plate 28 is referred to as a "positive A-plate A-28".

In a case where the optical characteristics of the positive A-plate A-28 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 29

A polarizing plate 29 of Example 29 was manufactured by the same method as in Example 27, except that the blending amount of the specific acidic compound A-5 was changed to 5.00 parts by mass. Furthermore, in the following description, the optically anisotropic film (phase difference film) included in the polarizing plate 29 is referred to as a "positive A-plate A-29".

In a case where the optical characteristics of the positive A-plate A-29 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 30

A polarizing plate 30 of Example 30 was manufactured by the same method as in Example 1, except that 2.00 parts by mass of a specific acidic compound A-14 represented by Formula A-14 was used instead of the specific acidic compound A-1. Furthermore, in the following description, the optically anisotropic film (phase difference film) included in the polarizing plate 30 is referred to as a "positive A-plate A-30".

In a case where the optical characteristics of the positive A-plate A-30 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

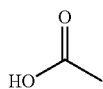

A-14

Example 31

A polarizing plate 31 of Example 31 was manufactured by the same method as in Example 1, except that 0.5 parts by mass of a specific acidic compound A-15 represented by Formula. A-15 was used instead of the specific acidic compound A-1. Furthermore, in the following description, the optically anisotropic film (phase difference film) included in the polarizing plate 31 is referred to as a "positive A-plate A-31".

In a case where the optical characteristics of the positive A-plate A-31 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

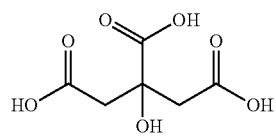

A-15

Example 32

A polarizing plate 32 of Example 32 was manufactured by the same method as in Example 31, except that the blending amount of the specific acidic compound A-15 was changed to 2.00 parts by mass. Furthermore, in the following description, the optically anisotropic film (phase difference film) included in the polarizing plate 32 is referred to as a "positive A-plate A-32".

In a case where the optical characteristics of the positive A-plate A-32 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Example 33

A coating liquid A-33 for forming a positive A-plate A-33 having the following formulation was prepared.

| Formulation of coating liquid A-33 for forming positive A-plate A-33 | |
| --- | --- |
| The following polymerizable liquid crystal compound L-3 | 29.60 parts by mass |
| The following polymerizable liquid crystal compound L-4 | 55.10 parts by mass |
| Polymerizable compound X-1 | 5.00 parts by mass |
| The following polymerizable compound X-2 | 10.30 parts by mass |
| Polymerization initiator S-1 | 0.50 parts by mass |
| Specific acidic compound A-15 | 0.50 parts by mass |
| Leveling agent (compound T-1) | 0.15 parts by mass |
| Methyl ethyl ketone (solvent) | 181.00 parts by mass |
| Cyclopentanone (solvent) | 54.10 parts by mass |

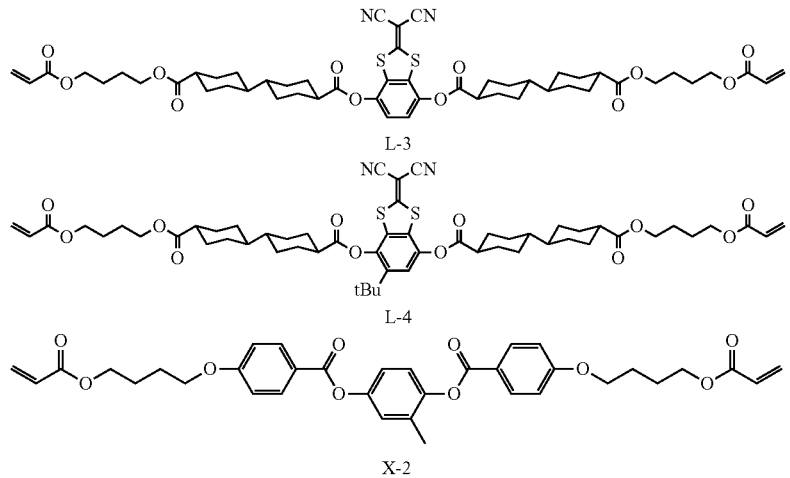

Next, a coating liquid A-33 for forming a positive A-plate A-33 was applied on the photo-alignment-treated surface using a bar coater. After aging by heating at a film surface temperature of 135° C. for 20 seconds and cooling to 120° C., the film was irradiated with ultraviolet rays at 1,000 mJ/cm² in the air using an air-cooling metal halide lamp (manufactured by EYEGRAPHICS Co., Ltd.) to fix the alignment state, thereby forming a polarizing plate 33. Furthermore, in the following description, the optically anisotropic film (phase difference film) included in the polarizing plate 33 is referred to as a "positive A-plate A-33".

In a case where the optical characteristics of the positive A-plate A-33 were measured, Re and Rth at a wavelength of 550 nm were 140 nm and 73 nm, respectively, Re(550)/Re (450) was 1.22, Re(650)/Re(550) was 1.03, the tilt angle of the optical axis was 0°, and the polymerizable liquid crystal compound was homogeneously aligned.

Example 34

A polarizing plate 34 of Example 34 was manufactured by the same method as in Example 33, except that the blending amount of the specific acidic compound A-15 was changed to 2.00 parts by mass. Furthermore, in the following description, the optically anisotropic film (phase difference film) included in the polarizing plate 34 is referred to as a "positive A-plate A-34".

In a case where the optical characteristics of the positive A-plate A-34 were measured, Re and Rth at a wavelength of 550 nm were 140 nm and 73 nm, respectively, Re(550)/Re (450) was 1.22, Re(650)/Re(550) was 1.03, the tilt angle of the optical axis was 0°, and the polymerizable liquid crystal compound was homogeneously aligned.

Comparative Example 1

A polarizing plate B1 of Comparative Example 1 was manufactured by the same method as in Example 1, except that the specific acidic compound A-1 was not used. Furthermore, in the following description, the optically anisotropic film (phase difference film) included in the polarizing plate B1 is referred to as a "positive A-plate B-1".

In a case where the optical characteristics of the positive A-plate B-1 were measured, Re and Rth at a wavelength of 550 nm were 145 nm and 73 nm, respectively, Re(550)/Re (450) was 1.12, Re(650)/Re(550) was 1.01, the tilt angle of the optical axis was 0°, and the polymerizable liquid crystal compound was homogeneously aligned.

Comparative Example 2

A polarizing plate B2 of Comparative Example 2 was manufactured by the same method as in Example 1, except that 0.10 parts by mass of an acidic compound B-1 represented by Formula B-1 was used instead of the specific acidic compound A-1. Furthermore, in the following description, the optically anisotropic film (phase difference film) included in the polarizing plate B2 is referred to as a "positive A-plate B-2".

In a case where the optical characteristics of the positive A-plate B-2 were measured, Re and Rth at a wavelength of 550 nm were 145 nm and 73 nm, respectively, Re(550)/Re (450) was 1.12, Re(650)/Re(550) was 1.01, the tilt angle of the optical axis was 0°, and the polymerizable liquid crystal compound was homogeneously aligned.

B-1

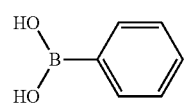

Comparative Example 3

A polarizing plate B3 of Comparative Example 3 was manufactured by the same method as in Example 7, except that the blending amount of the specific acidic compound A-4 was changed to 25.00 parts by mass. Furthermore, in the following description, the optically anisotropic film (phase difference film) included in the polarizing plate B3 is referred to as a "positive A-plate B-3".

In a case where the optical characteristics of the positive A-plate B-3 were measured, Re and Rth at a wavelength of 550 nm were 145 nm and 73 nm, respectively, Re(550)/Re(450) was 1.12, Re(650)/Re(550) was 1.01, the tilt angle of the optical axis was 0°, and the polymerizable liquid crystal compound was homogeneously aligned.

Durability

In the polarizing plate prepared in each of Examples and Comparative Examples as described above, the positive A-plate was bonded onto the glass side of a glass plate via a pressure-sensitive adhesive trade name "SK2057", manufactured by Soken Chemical & Engineering Co., Ltd.)

The durability of the retardation value (Re) at a wavelength of 550 nm was evaluated using AxoScan (OPMF-1, manufactured by Axometrics, Inc.) using the following index. The results are shown in Table 4 below.

In addition, with regard to the test conditions, a test of being left in an environment of 105° for 120 hours was performed.

AA: A variation in an Re value after the test with respect to an initial Re value is less than 3%.

A: A variation in an Re value after the test with respect to an initial Re value is 3% or more and less than 6%.

B: A variation in an Re value after the test with respect to an initial Re value is 6% or more and less than 12%.

C: A variation in an Re value after the test with respect to an initial Re value is 12% or more and less than 20%.

D: A variation in an Re value after the test with respect to an initial Re value is 20% or more.

TABLE 4

| | Polymerizable liquid crystal compound (1) | Polymerizable compound | Acidic compound | | | | | Durability 105° C., |
|---|---|---|---|---|---|---|---|---|
| | | | | | | Value of Expression | Blending amount (parts | |
| | Type | Type | Type | Type | pKa | Molecular weight | (1) | by mass) ※ | 120 hrs |
| Example 1 | L-1 | L-2 | X-1 | A-1 | 5.0 | 170.30 | 0.033 | 0.50 | B |
| Example 2 | L-1 | L-2 | X-1 | A-1 | 5.0 | 170.30 | 0.133 | 2.00 | B |
| Example 3 | L-1 | L-2 | X-1 | A-2 | 4.2 | 164.80 | 0.035 | 0.50 | B |
| Example 4 | L-1 | L-2 | X-1 | A-2 | 4.2 | 164.80 | 0.140 | 2.00 | B |
| Example 5 | L-1 | L-2 | X-1 | A-3 | 2.1 | 211.09 | 0.041 | 0.50 | B |
| Example 6 | L-1 | L-2 | X-1 | A-3 | 2.1 | 211.09 | 0.166 | 2.00 | B |
| Example 7 | L-1 | L-2 | X-1 | A-4 | -2.1 | 172.02 | 0.064 | 0.50 | A |
| Example 8 | L-1 | L-2 | X-1 | A-4 | -2.1 | 172.02 | 0.254 | 2.00 | B |
| Example 9 | L-1 | L-2 | X-1 | A-5 | 2.2 | 158.01 | 0.041 | 0.50 | B |
| Example 10 | L-1 | L-2 | X-1 | A-5 | 2.2 | 158.01 | 0.165 | 2.00 | AA |
| Example 11 | L-1 | L-2 | X-1 | A-5 | 2.2 | 158.01 | 0.412 | 5.00 | AA |
| Example 12 | L-1 | L-2 | X-1 | A-6 | 1.6 | 235.92 | 0.043 | 0.50 | B |
| Example 13 | L-1 | L-2 | X-1 | A-6 | 1.6 | 235.92 | 0.173 | 2.00 | A |
| Example 14 | L-1 | L-2 | X-1 | A-6 | 1.6 | 235.92 | 0.432 | 5.00 | A |
| Example 15 | L-1 | L-2 | X-1 | A-7 | 2.1 | 174.01 | 0.041 | 0.50 | B |
| Example 16 | L-1 | L-2 | X-1 | A-7 | 2.1 | 174.01 | 0.165 | 2.00 | A |
| Example 17 | L-1 | L-2 | X-1 | A-8 | 1.9 | 322.23 | 0.042 | 0.50 | B |
| Example 18 | L-1 | L-2 | X-1 | A-8 | 1.9 | 322.23 | 0.168 | 2.00 | A |
| Example 19 | L-1 | L-2 | X-1 | A-9 | 0.9 | 250.04 | 0.046 | 0.50 | B |
| Example 20 | L-1 | L-2 | X-1 | A-9 | 0.9 | 250.04 | 0.184 | 2.00 | A |
| Example 21 | L-1 | L-2 | X-1 | A-10 | -0.8 | 232.08 | 0.054 | 0.50 | A |
| Example 22 | L-1 | L-2 | X-1 | A-5 | 2.2 | 158.01 | 0.008 | 0.10 | C |
| Example 23 | L-1 | L-2 | X-1 | A-4 | -2.1 | 158.01 | 1.519 | 12.00 | C |
| Example 24 | L-5 | — | — | A-5 | 2.2 | 158.01 | 0.041 | 0.50 | B |
| Example 25 | L-5 | — | — | A-5 | 2.2 | 158.01 | 0.165 | 2.00 | AA |
| Example 26 | L-5 | — | — | A-5 | 2.2 | 158.01 | 0.412 | 5.00 | AA |
| Example 27 | L-7 | — | — | A-5 | 2.2 | 158.01 | 0.041 | 0.50 | B |
| Example 28 | L-7 | — | — | A-5 | 2.2 | 158.01 | 0.165 | 2.00 | AA |
| Example 29 | L-7 | — | — | A-5 | 2.2 | 158.01 | 0.412 | 5.00 | AA |
| Example 30 | L-1 | L-2 | X-1 | A-14 | 4.5 | 60.05 | 0.138 | 2.00 | C |
| Example 31 | L-1 | L-2 | X-1 | A-15 | 3.1 | 192.12 | 0.038 | 0.50 | B |
| Example 32 | L-1 | L-2 | X-1 | A-15 | 3.1 | 192.12 | 0.153 | 2.00 | B |
| Example 33 | L-3 | L-4 | X-1/X-2 | A-15 | 3.1 | 192.12 | 0.038 | 0.50 | AA |
| Example 34 | L-3 | L-4 | X-1/X-2 | A-15 | 3.1 | 192.12 | 0.153 | 2.00 | AA |
| Comparative Example 1 | L-1 | L-2 | X-1 | — | — | — | — | 0.00 | D |
| Comparative Example 2 | L-1 | L-2 | X-1 | B-1 | 8.8 | 122.05 | 0.005 | 0.10 | D |
| Comparative Example 3 | L-1 | L-2 | X-1 | A-4 | -2.1 | 172.02 | 3.181 | 25.00 | D |

※ indicates an amount (parts by mass) with respect to a total amount of a polymerizable liquid crystal compound (1) and a polymerizable compound.

From the results shown in Table 4, it was found that in a case where the specific acidic compound was not blended, the durability of the optically anisotropic film was deteriorated (Comparative Example 1).

Furthermore, it was also found that in a case where an acidic compound having a pKa in the range of more than −10 and 5 or less was used, the durability of the optically anisotropic film was deteriorated (Comparative Example 2).

In addition, it was also found that even in a case where a specific acidic compound having a pKa in the range of more than −10 and 5 or less was used, a large blending amount thereof deteriorates the durability of the optically anisotropic film (Comparative Example 3).

In contrast, in a case where a predetermined amount of a specific acidic compound having a pKa within a range of more than −10 and 5 or less is blended with a predetermined polymerizable liquid crystal compound, the durability of an optically anisotropic film thus formed is improved (Examples 1 to 34).

Furthermore, from the comparison between Examples 1 to and 30 to 32, it was found that the durability of an optically anisotropic film formed was further improved in a case where the specific acidic compound satisfies Expression (I).

Similarly, from the comparison of Examples 1 to 23 and 30 to 32, it was found that in a case where the specific acidic compound has a molecular weight of 120 or more, the durability of an optically anisotropic film thus formed is improved.

Similarly, from the comparison of Examples 1 to 23 and 30 to 32, it was found that in a case where the compound is at least one compound selected from the group consisting of a phosphoric acid compound, a phosphonic acid compound, and a sulfonic acid compound, the durability of an optically anisotropic film thus formed tends to be further improved, and in particular, in a case where the specific acidic compound is the phosphonic acid compound or the sulfonic acid compound, the durability of an optically anisotropic film thus formed is further improved.

EXPLANATION OF REFERENCES

10: optical film
12: optically anisotropic film
14: alignment film
16: support
18: hard coat layer

What is claimed is:
1. A polymerizable liquid crystal composition comprising:
a polymerizable liquid crystal compound represented by Formula (1); and
an acidic compound,
wherein a pKa of the acidic compound is more than −10 and 5 or less, and
a content of the acidic compound is 0.05 to 5 parts by mass with respect to 100 parts by mass of the polymerizable liquid crystal compound,
the acidic compound is a compound represented by any one of the following formulas A-1 to A-13 and A-15,

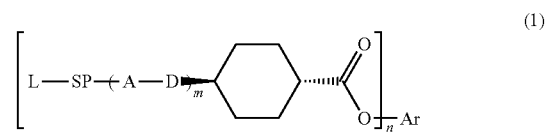

in Formula (1),

Ar represents a divalent aromatic group,

D represents a single bond, —COO—, or —OCO—,

A represents an aromatic ring having 6 or more carbon atoms, which may have a substituent, or a cycloalkane ring having 6 or more carbon atoms, which may have a substituent, SP represents a single bond, a linear alkylene group having 1 to 12 carbon atoms, a branched alkylene group having 3 to 12 carbon atoms, or a divalent linking group in which one or more of —CH$_2$-'s constituting the linear or branched alkylene group are substituted with —O—, —S—, —NH—, —N(Q)-, or —CO—, and Q represents a substituent, L represents a polymerizable group, and m represents an integer of 0 to 2, and n represents an integer of 2, provided that a plurality of D's, A's, SP's, and L's, all of which are plural depending on a value of m or n, may be the same as or different from each other,

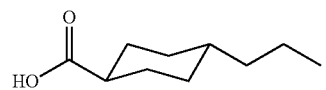

A-1

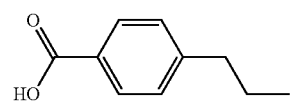

A-2

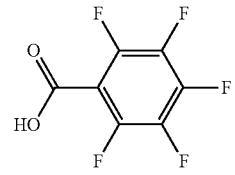

A-3

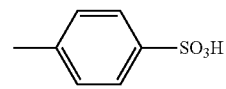

A-4

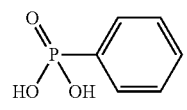

A-5

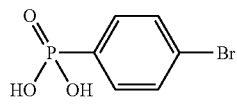

A-6

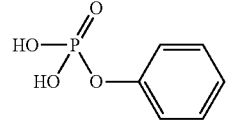

A-7

A-8
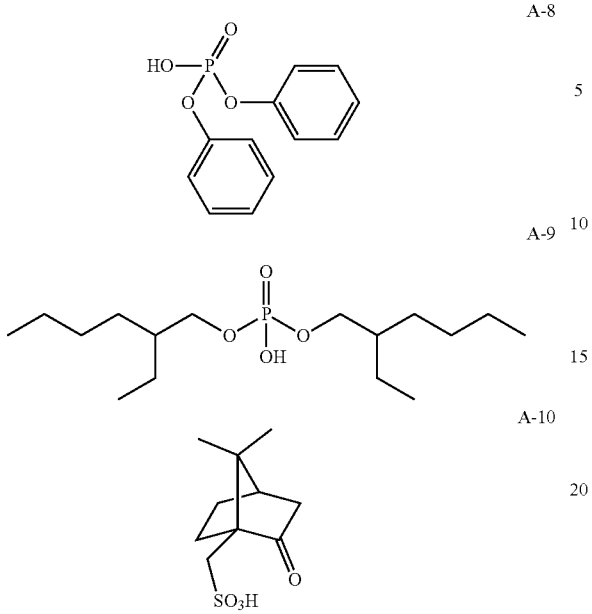
A-9
A-10
A-11
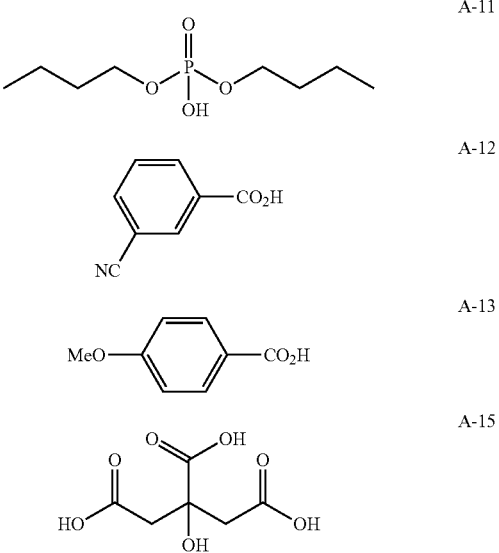
A-12
A-13
A-15
* * * * *